(12) United States Patent
Fujimoto et al.

(10) Patent No.: US 11,370,215 B2
(45) Date of Patent: Jun. 28, 2022

(54) PRINTING DEVICE

(71) Applicant: YAMAHA HATSUDOKI KABUSHIKI KAISHA, Iwata (JP)

(72) Inventors: Takeshi Fujimoto, Iwata (JP); Jinok Park, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 0 days.

(21) Appl. No.: 17/051,144

(22) PCT Filed: Jun. 5, 2018

(86) PCT No.: PCT/JP2018/021534
§ 371 (c)(1),
(2) Date: Oct. 27, 2020

(87) PCT Pub. No.: WO2019/234821
PCT Pub. Date: Dec. 12, 2019

(65) Prior Publication Data
US 2021/0229416 A1    Jul. 29, 2021

(51) Int. Cl.
*B41F 15/36*     (2006.01)
*B41F 15/08*     (2006.01)
*B41F 15/44*     (2006.01)
*H05K 3/12*      (2006.01)

(52) U.S. Cl.
CPC .......... *B41F 15/0881* (2013.01); *B41F 15/36* (2013.01); *B41F 15/44* (2013.01); *H05K 3/1225* (2013.01); *H05K 3/1233* (2013.01)

(58) Field of Classification Search
CPC ....... B41F 15/0881; B41F 15/12; B41F 33/16
See application file for complete search history.

(56) References Cited

U.S. PATENT DOCUMENTS

| 5,713,277 A | 2/1998 | Szarka | |
|---|---|---|---|
| 2013/0309051 A1* | 11/2013 | Yamagata | H05K 13/0434 |
| | | | 414/267 |
| 2020/0331257 A1* | 10/2020 | Fujimoto | B41F 15/36 |

FOREIGN PATENT DOCUMENTS

| CN | 101648454 A | | 2/2010 | |
|---|---|---|---|---|
| CN | 101850649 | * | 10/2010 | ............. B41F 15/08 |
| CN | 102233712 A | | 11/2011 | |
| EP | 2664565 | * | 11/2013 | ......... H05K 13/0061 |
| JP | H01257049 A | | 10/1989 | |
| JP | H05299812 A | | 11/1993 | |
| JP | 06071847 | * | 3/1994 | ............. B41F 15/34 |

(Continued)

OTHER PUBLICATIONS

An Office Action; "Notice of Reasons for Refusal", mailed by the Japanese Patent Office dated Sep. 7, 2021, which corresponds to Japanese Patent Application No. 2020-523880 and is related to U.S. Appl. No. 17/051,144; with English language translation.

(Continued)

*Primary Examiner* — Matthew G Marini
*Assistant Examiner* — Marissa Ferguson-Samreth
(74) *Attorney, Agent, or Firm* — Studebaker & Brackett PC

(57) ABSTRACT

In a printing device, a second storage position is displaced from a first storage position so as to enable a moving member to move a second mask arranged in a second storage in a state in which a first mask is arranged in the first storage position by movement of the first mask from an operation position to the first storage position by the moving member.

20 Claims, 9 Drawing Sheets

(56) References Cited

FOREIGN PATENT DOCUMENTS

| | | | | |
|---|---|---|---|---|
| JP | 0839786 | * | 2/1996 | .............. B41F 35/00 |
| JP | 2861332 | * | 2/1999 | .............. B41F 15/36 |
| JP | 2861332 B2 | | 2/1999 | |
| JP | 2002-225226 A | | 8/2002 | |
| JP | 2018039173 A | | 3/2018 | |
| JP | 2018105016 | * | 6/2018 | .......... B41F 15/0881 |
| KR | 100463382 | * | 9/2005 | .............. B41F 17/14 |

OTHER PUBLICATIONS

An Office Action mailed by the China National Intellectual Property Administration dated Jun. 3, 2021, which corresponds to Chinese Patent Application No. 201880092609.2 and is related to U.S. Appl. No. 17/051,144.
International Search Report issued in PCT/JP2018/021534; dated Jul. 24, 2018.
Written Opinion issued in PCT/JP2018/021534; dated Jul. 24, 2018.

* cited by examiner

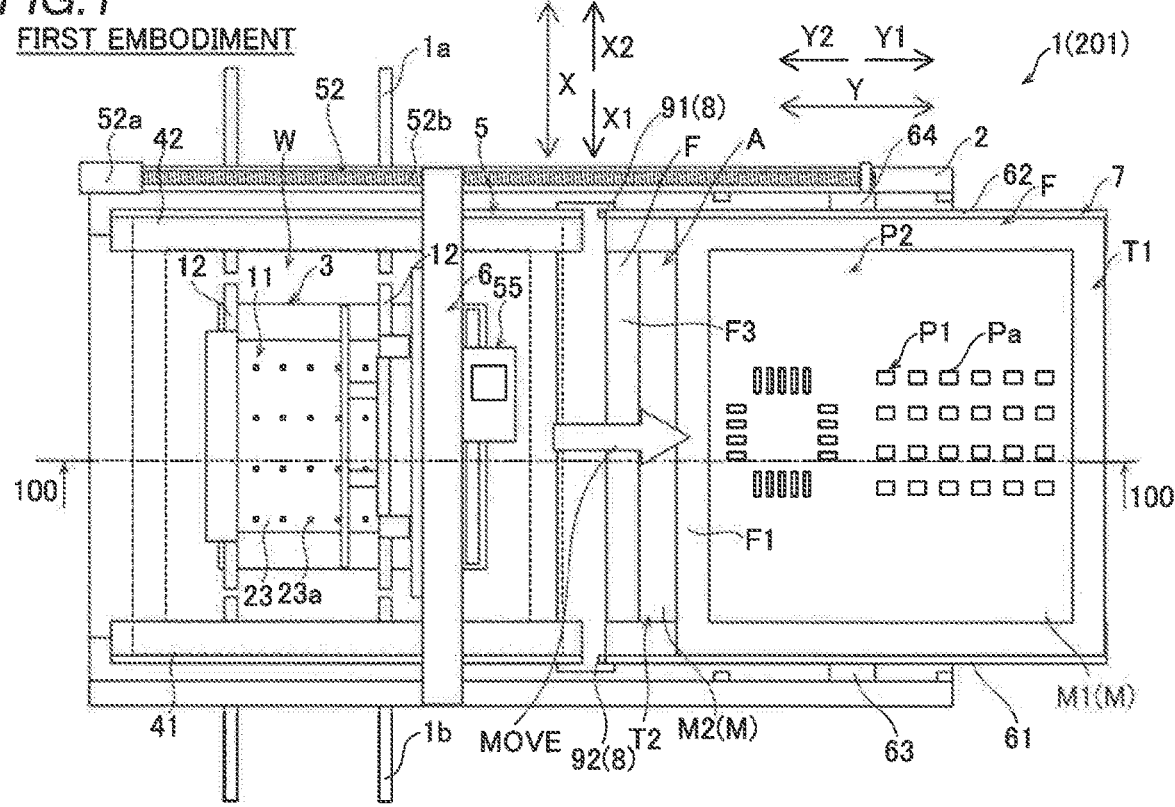
FIG.1 FIRST EMBODIMENT
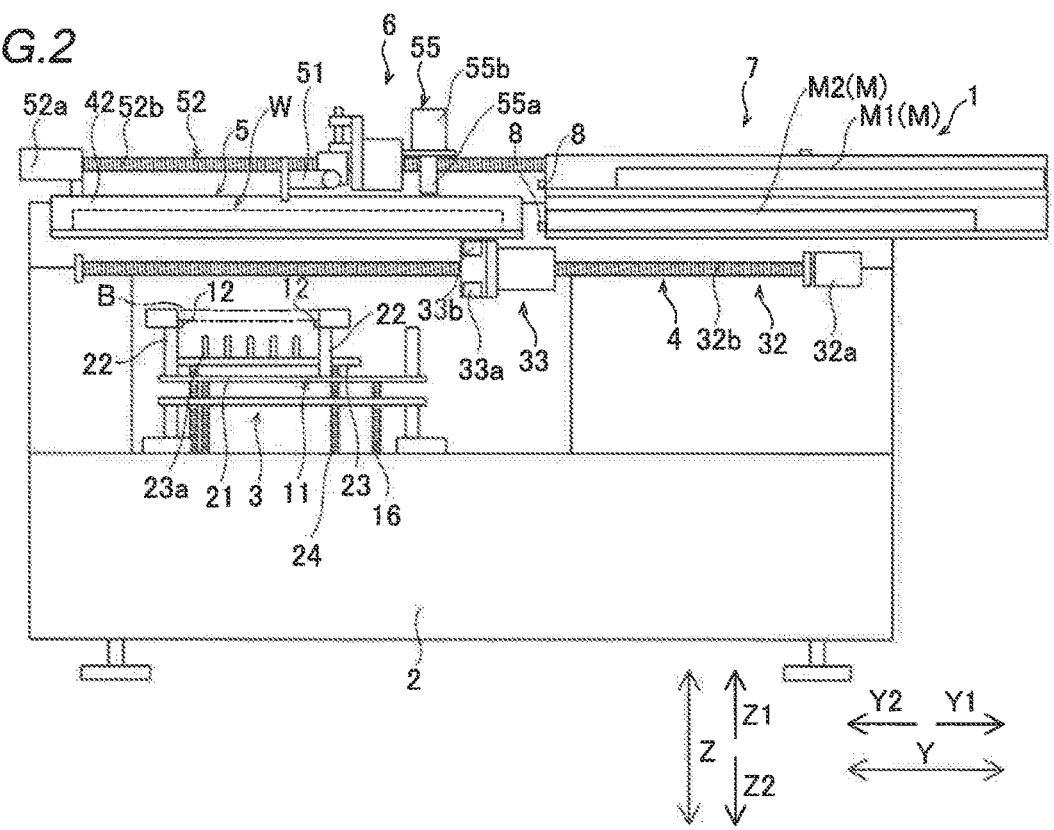
FIG.2

SECOND EMBODIMENT

FIRST MODIFIED EXAMPLE

SECOND MODIFIED EXAMPLE

PRINTING DEVICE

CROSS-REFERENCE TO RELATED APPLICATION

This application is a National Stage of International Patent Application No. PCT/JP2018/021534, filed Jun. 5, 2018, the entire content of which is incorporated herein by reference.

BACKGROUND

Technical Field

The present disclosure relates to a printing device, and more particularly, it relates to a printing device configured to print a coating material on a mask arranged in an operation position on a board arranged in a printing position.

Background Art

Conventionally, a printing device configured to print a coating material on a mask arranged in an operation position on a board arranged in a printing position is known. A printing device is disclosed in Japanese Patent No. 2861332, for example.

Japanese Patent No. 2861332 discloses a screen printing device including a printing unit and a screen mask storage. The printing unit includes a screen mask, a mask holder that holds the screen mask, and a bracket that slides along rails by driving of a motor. The bracket includes a squeegee, a first slider (moving member) arranged on the side opposite to the storage, and a second slider (moving member) arranged on the storage side. Furthermore, the storage includes a stocker including a plurality of take-in/take-out means each including a belt conveyor, an elevating means configured to move the stocker up and down, and a transfer means including a belt conveyor configured to convey the screen mask from the printing unit to the stocker.

In the screen printing device described in Japanese Patent No. 2861332, the screen mask is moved toward the stocker by the first slider and the second slider so as to be placed on the transfer means. Then, in the screen printing device, the screen mask is transferred to the stocker by the transfer means, and the screen mask is stored in the stocker by any of the plurality of take-in/take-out means each including a belt conveyor. Furthermore, in the screen printing device, the screen mask is sent to the transfer means by the take-in/take-out means including a belt conveyor so as to be taken out from the stocker. In this manner, the screen mask is replaced in the screen printing device.

SUMMARY

However, in the screen printing device described in Japanese Patent No. 2861332, the belt conveyor is arranged in the stocker in order to provide the take-in/take-out means configured to take the screen mask in/out from the stocker, and thus the size of the stocker is disadvantageously increased. Therefore, there is a problem that it is difficult to significantly reduce or prevent an increase in the size of the printing device due to an increase in the size of the stocker (so-called mask replacement unit) that stores a mask to replace the screen mask.

Therefore, the present disclosure provides a printing device capable of significantly reducing or preventing an increase in the size of the entire device due to an increase in the size of a mask replacement unit.

A printing device according to an aspect of the present disclosure includes a squeegee configured to print, on a board arranged in a printing position, a coating material on a first mask arranged in an operation position, a moving member including a mask contact portion configured to contact the first mask, the moving member being configured to move the first mask while bringing the mask contact portion into contact with the first mask, and a mask replacement unit including a first storage configured to store the first mask in a first storage position and a second storage configured to store, in a second storage position, a second mask replaced with the first mask and arranged in the operation position. The second storage position is displaced from the first storage position so as to enable the moving member to move the second mask arranged in the second storage in a state in which the first mask is arranged in the first storage position by movement of the first mask from the operation position to the first storage position by the moving member.

In the printing device according to this aspect of the present disclosure, as described above, the second storage position is displaced from the first storage position so as to enable the moving member to move the second mask arranged in the second storage in a state in which the first mask is arranged in the first storage position by movement of the first mask from the operation position to the first storage position by the moving member including the mask contact portion. Accordingly, even when the first mask is arranged in the first storage position, the mask contact portion can be brought into contact with the second mask displaced from the first storage position. Therefore, the second mask stored in the second storage position can be moved by the moving member without using a structure other than the moving member such as a belt conveyor to move the second mask from the second storage position, and thus an increase in the size of the printing device due to an increase in the size of the mask replacement unit can be significantly reduced or prevented. Furthermore, the moving member can directly move the first mask arranged in the operation position to the first storage position of the first storage and can directly move the second mask arranged in the second storage position to the operation position. Thus, as compared with a structure in which the mask is moved between the operation position and the first storage position or the second storage position by a transfer means including a belt conveyor, an increase in the size of the printing device due to an increase in the size of the mask replacement unit can be significantly reduced or prevented.

In the aforementioned printing device according to this aspect, the first storage is preferably arranged above the second storage, and the second storage position is preferably displaced from the first storage position toward the operation position so as to enable the moving member to move the second mask to the operation position in a state in which the first mask is stored in the first storage position of the first storage. Accordingly, after the first mask is stored in the first storage position, the moving member can easily access the second mask arranged in the second storage position from above, and thus a complex structure of the printing device can be significantly reduced or prevented.

In the aforementioned printing device including the first storage arranged above the second storage, the mask contact portion is preferably movable in an upward-downward direction. Also, each of the first mask and the second mask preferably includes a first frame provided at an end thereof in a first movement direction from the operation position toward the mask replacement unit, and a second frame provided at an end thereof in a direction opposite to the first movement direction. The first storage preferably includes a gap formed on at least a side of the operation position relative to the first storage position, with the gap being configured to allow the mask contact portion of the moving member to pass therethrough. Also, the mask replacement unit is preferably configured to bring the mask contact portion into contact with the second frame of the second mask stored in the second storage position of the second storage through the gap by moving the mask contact portion downward in a state in which the first mask is stored in the first storage position of the first storage. Accordingly, the gap is simply provided in the first storage such that after the first mask is stored in the first storage position, the mask contact portion of the moving member can access the second mask arranged in the second storage position. Therefore, a complex structure of the printing device can be further significantly reduced or prevented.

The aforementioned printing device according to this aspect preferably further includes an imager arranged in a region between the printing position and the operation position, with the imager being movable in a horizontal direction. Also, the mask replacement unit preferably further includes an elevating unit configured to move the first storage and the second storage up and down to a first predetermined position in which the operation position and the first storage position are adjacent to each other and a second predetermined position in which the operation position and the second storage position are adjacent to each other. The elevating unit is preferably configured to lower the first storage and the second storage based on the imager retracted below the operation position so as to arrange the first storage in the first predetermined position. Accordingly, even when the second storage and the imager are arranged close to each other to an interference position, interference between the second storage and the imager can be prevented, and thus the printing device can be downsized.

In the aforementioned printing device in which the elevating unit is configured to lower the first storage and the second storage based on the retracted imager, the mask contact portion provided in the moving member is preferably a single portion. Also, each of the first mask and the second mask preferably includes a first frame provided at an end thereof in a first movement direction from the operation position toward the mask replacement unit, and a second frame provided at an end thereof in a direction opposite to the first movement direction. The first mask is preferably configured to be moved in the first movement direction while the mask contact portion is brought into contact with the first frame of the first mask in a state of the first predetermined position so as to overlap a portion of the first mask with a portion of the second mask, and then be stored in the first storage while the mask contact portion is brought into contact with the second frame of the first mask. The second mask is preferably configured to be moved in a direction opposite to the first movement direction while the mask contact portion is brought into contact with the second frame of the second mask in a state of the second predetermined position, and then be moved to the operation position while the mask contact portion is brought into contact with the first frame of the second mask. Accordingly, unlike a case in which a plurality of mask contact portions are used, a movement range is effectively utilized using the single mask contact portion such that the first mask can be stored in the first storage, and the second mask can be moved from the second storage to the operation position. Thus, a complex structure of the printing device can be further significantly reduced or prevented.

The aforementioned printing device according to this aspect preferably further includes a mask support configured to support the first mask or the second mask from below in the operation position, the first storage and the second storage preferably respectively include a first placement portion configured to allow the first mask to be placed thereon and a second placement portion configured to allow the second mask to be placed thereon. The first placement portion is preferably arranged below the mask support based on movement of the first mask in a first movement direction from the operation position toward the mask replacement unit, and the second placement portion is preferably arranged above the mask support based on movement of the second mask in a second movement direction opposite to the first movement direction. Accordingly, when the first mask moves from the operation position to the first storage position, the first mask is unlikely to be caught at an end of the first placement portion on the side of the operation position, and when the second mask moves from the second storage position to the operation position, the second mask is unlikely to be caught at an end of the mask support on a side of the second storage. Thus, movement of the first mask from the operation position to the first storage position and movement of the second mask from the second storage position to the operation position can be stably performed.

In this case, an end of the mask support on a side of the mask replacement unit is preferably inclined downward toward the mask replacement unit, and at least one of the first placement portion of the first storage or the second placement portion of the second storage is preferably inclined downward toward the mask support. Accordingly, when the first mask is moved from the operation position to the first storage position, the first mask is unlikely to be caught by the first placement portion due to the inclination of the first placement portion, and thus movement of the first mask from the operation position to the first storage position can be more stably performed. When the first mask is moved from the operation position to the second storage position, the first mask is unlikely to be caught by the second placement portion due to the inclination of the second placement portion, and thus movement of the first mask from the operation position to the second storage position can be more stably performed. Furthermore, when the second mask is moved from the second storage position to the operation position, the second mask is unlikely to be caught by the mask support due to the inclination of the mask support, and thus the second mask can be guided to the operation position. Thus, movement of the second mask from the second storage position to the operation position can be more stably performed.

In the aforementioned printing device including the mask support, the first storage and the second storage preferably respectively include a first placement portion configured to allow the first mask to be placed thereon and a second placement portion configured to allow the second mask to be placed thereon. Also, the printing device preferably further includes a detection sensor arranged between the mask support and the mask replacement unit, with the detection sensor being configured to detect a state in which at least one of the first mask or the second mask straddles the mask support and the mask replacement unit. Accordingly, the detection sensor can detect a state in which at least one of the first mask or the second mask straddles the mask support and the mask replacement unit, and thus the occurrence of a state (inconvenience) in which the printing device continues to work while at least one of the first mask or the second mask straddles the mask support and the mask replacement unit can be significantly reduced or prevented.

In the aforementioned printing device according to this aspect, the squeegee and the moving member are preferably integrally arranged in a squeegee unit, and the squeegee and the moving member are preferably configured to integrally move as the squeegee unit moves. Accordingly, the printing device can be downsized as compared with a case in which the squeegee and the moving member are provided separately.

According to the present disclosure, as described above, it is possible to provide the printing device capable of significantly reducing or preventing an increase in its size.

BRIEF DESCRIPTION OF THE DRAWINGS

FIG. 1 is a plan view showing the overall structure of a printing device according to a first embodiment;

FIG. 2 is a sectional view taken along the line 100-100 in FIG. 1;

DETAILED DESCRIPTION

Figure 3:
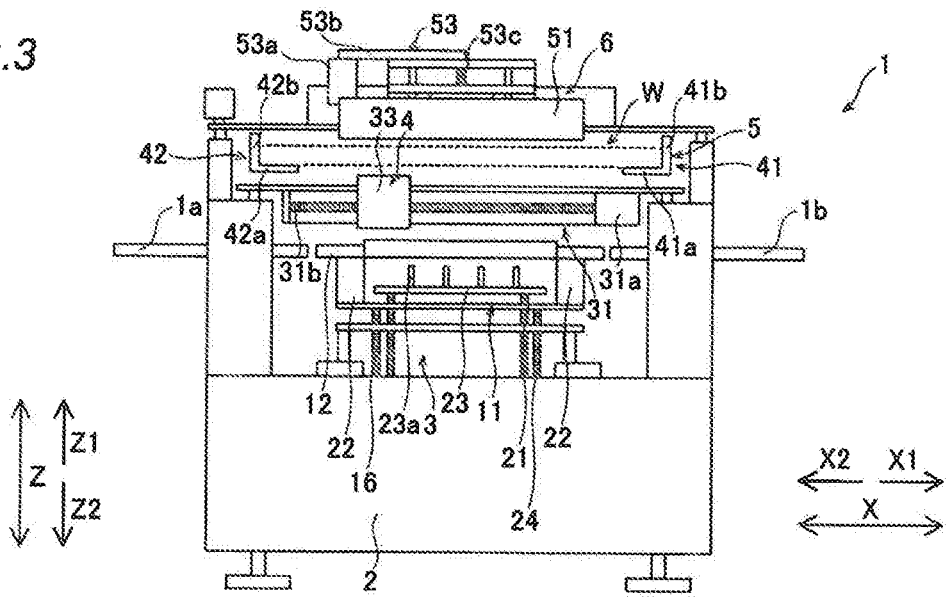
FIG. 3 is a side view showing the overall structure of the printing device according to the first embodiment.

Embodiments embodying the present disclosure are hereinafter described on the basis of the drawings.

First Embodiment

A printing device 1 according to a first embodiment of the present disclosure is now described with reference to FIGS. 1 to 9C. As shown in FIG. 1, the printing device 1 is a device that conveys a board B (see FIG. 2) in an X1 direction by a pair of conveyors 12 and prints solder on the board B in a printing position. The conveyance direction of the pair of conveyors 12 on which the board B is placed and the opposite direction are defined as an X direction, and a direction orthogonal to the X direction in a horizontal direction is defined as a Y direction. Furthermore, a direction orthogonal to the X direction and the Y direction is defined as a Z direction (upward-downward direction). The solder is an example of a "coating material" in the claims.

As shown in FIG. 1, the printing device 1 is configured to perform a printing process on a surface of the board B carried in by carry-in conveyors 1a with a predetermined pattern Pa of a plurality of openings P1 formed in a mask M, and then carry out the board B that has been printed by carry-out conveyors 1b. The mask M has a rectangular shape in a plan view. The mask M includes the openings P1 that form the predetermined pattern Pa and a non-printing region P2 that is a region other than the openings P1. Furthermore, the mask M has a frame F attached to its outer peripheral portion. Note that FIG. 1 is a diagram showing a state in which the mask M has been moved from an operation position W in which a printing process is performed on the mask M to a mask replacement unit 7 described below.

Figure 7:
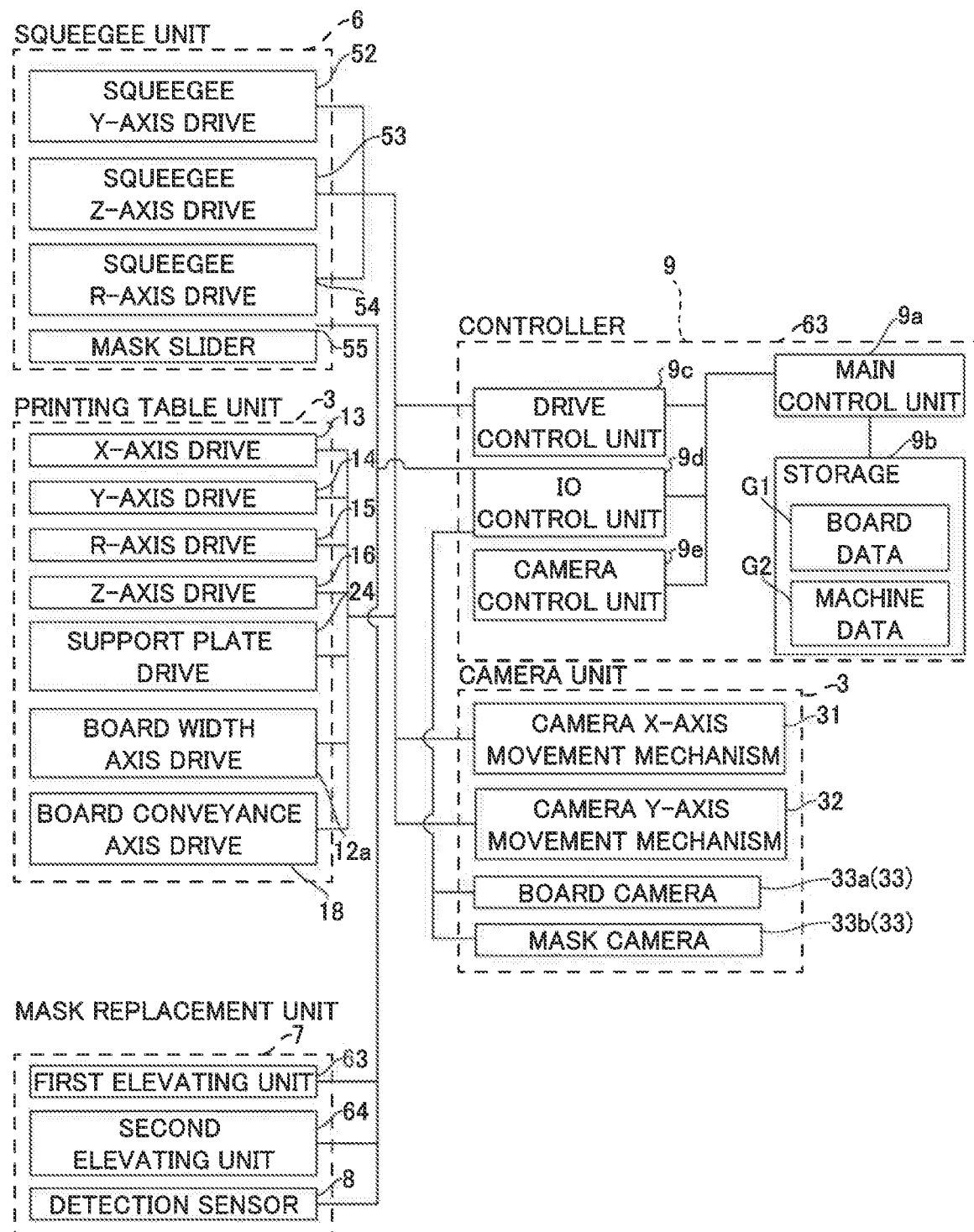
FIG. 7 is a block diagram showing the control structure of the printing device according to the first embodiment.

Specifically, as shown in FIG. 2, the printing device 1 includes a base 2, a printing table unit 3, a camera unit 4 (see FIG. 2), a mask clamp member 5, a squeegee unit 6, the mask replacement unit 7, detection sensors 8, and a controller 9 (see FIG. 7).

The printing table unit 3 is provided on the base 2, and is configured to hold the board B and align the board B with respect to the mask M. Specifically, the printing table unit 3 includes an X-axis movement mechanism (not shown), a Y-axis movement mechanism (not shown), an R-axis movement mechanism (not shown), and a Z-axis movement mechanism (not shown), a printing table 11, and the pair of conveyors 12 (see FIG. 1).

The X-axis movement mechanism uses an X-axis drive 13 (see FIG. 7) as a drive source to move the printing table 11 in an X-axis direction. The Y-axis movement mechanism uses a Y-axis drive 14 (see FIG. 7) as a drive source to move the printing table 11 in a Y-axis direction. The R-axis movement mechanism uses an R-axis drive 15 (see FIG. 7) as a drive source to move the printing table 11 in an R-axis direction, which is a rotation direction about a central axis that extends in the Z direction. The Z-axis movement mechanism uses a Z-axis drive 16 (see FIG. 7) as a drive source to move the printing table 11 in a Z-axis direction.

The printing table 11 includes a table body 21, a pair of bracket members 22 provided on the table body 21, a support plate 23 on which a plurality of backup pins 23a are arranged, and a support plate drive 24 configured to move the support plate 23 in the Z direction. The conveyor 12 is provided on each of upper portions of the pair of bracket members 22. The backup pins 23a are configured to support the board B by moving the support plate 23 in a Z1 direction (upward direction) by the support plate drive 24.

As shown in FIG. 1, the pair of conveyors 12 are provided so as to extend along the X direction. The pair of conveyors 12 are arranged parallel to each other with a predetermined distance in the Y direction. Furthermore, an interval between the pair of conveyors 12 in the Y direction can be adjusted according to the width of the board B to be conveyed. Specifically, a board width axis drive 12a (see FIG. 7) is driven to adjust the interval (width) between the pair of conveyors 12.

The camera unit 4 is configured to position the board B with respect to the mask M, as shown in FIGS. 2 and 3. Specifically, the camera unit 4 includes a camera X-axis movement mechanism 31, a camera Y-axis movement mechanism 32, and an imager 33 including a board camera 33a and a mask camera 33b. The camera X-axis movement mechanism 31 includes an X-axis motor 31a and a ball screw 31b that extends in the X direction. The camera Y-axis movement mechanism 32 includes a Y-axis motor 32a and a ball screw 32b that extends in the Y direction. The board camera 33a is configured to recognize the relative position of the board B with respect to the printing table 11. The mask camera 33b is configured to recognize the position of the mask M.

Thus, in the printing device 1, after the relative position of the board B with respect to the mask M is recognized using the board camera 33a and the mask camera 33b, the relative position (the position and inclination in a horizontal plane) of the board B with respect to the mask M is accurately positioned by the X-axis movement mechanism, the Y-axis movement mechanism, and the R-axis movement mechanism of the printing table unit 3. Then, in the printing device 1, the board B is brought into contact with the lower surface of the mask M by the support plate drive 24 in a state in which the relative position of the board B with respect to the mask M has been accurately positioned.

As shown in FIG. 3, the mask clamp member 5 is configured to hold the mask M in the operation position W when the predetermined pattern Pa is printed on the board B using the mask M. Specifically, the mask clamp member 5 includes a first mask holder 41 that holds an end of the mask M on the Y1 direction side, and a second mask holder 42 that holds an end of the mask M on the Y2 direction side.

The first mask holder 41 has a substantially L shape. The first mask holder 41 includes a first support 41a that supports an end of the mask M on the X1 direction side from below, and a first standing portion 41b that stands in the Z1 direction (upward direction) from an end of the first support 41a on the X1 direction side. The second mask holder 42 has a substantially L shape. The second mask holder 42 includes a second support 42a that supports an end of the mask M on the X2 direction side from below, and a second standing portion 42b that stands in the Z1 direction (upward direction) from an end of the second support 42a on the X2 direction side. The first support 41a and the second support 42a are examples of a "mask support" in the claims.

Ends of the first support 41a and the second support 42a of the mask clamp member 5 on the Y1 direction side have end faces (see FIG. 1) along the Z direction.

As shown in FIGS. 2 and 3, the squeegee unit 6 is configured to reciprocate in the Y direction to move the solder supplied onto the upper surface of the mask M while scraping the solder along the upper surface of the mask M. Specifically, the squeegee unit 6 includes a squeegee 51, a squeegee Y-axis drive 52 that moves the squeegee 51 in a printing direction (Y direction), a squeegee Z-axis drive 53 that moves the squeegee 51 in the upward-downward direction (Z direction), and a squeegee R-axis drive 54 (see FIG. 7) that rotates the squeegee 51 about a rotation axis that extends in the X-axis direction.

The squeegee 51 extends in the X direction. The squeegee 51 is configured to print the solder supplied to the mask M while applying a predetermined printing pressure (load). The squeegee Y-axis drive 52 includes a Y-axis motor 52a and a ball screw 52b that extends in the Y direction. The squeegee Z-axis drive 53 includes a Z-axis motor 53a, a belt 53b, and a ball screw 53c that extends in the Z direction.

The squeegee unit 6 includes a mask slider 55 that slides the mask M in the Y direction, as shown in FIG. 2. A single mask slider 55 is arranged in the squeegee unit 6. The mask slider 55 includes a slide portion 55a that is movable in the Z direction (upward-downward direction) and a housing 55b that houses the slide portion 55a. The mask slider 55 includes an air cylinder, for example, the slide portion 55a includes a rod, and the housing 55b includes a cylinder. The mask slider 55 is an example of a "moving member" in the claims. The slide portion 55a is an example of a "mask contact portion" in the claims.

The mask slider 55 is configured to move integrally in the Y direction by movement of the squeegee 51 in the Y direction by the squeegee Y-axis drive 52. In the mask slider 55, the slide portion 55a moves in a Z2 direction (downward direction) to a position in which the slide portion 55a can contact the frame F of the mask M in the operation position W. At this time, the slide portion 55a protrudes in the Z2 direction (downward direction) from the housing 55b. In the mask slider 55, the slide portion 55a moves in the Z1 direction (upward direction) with respect to the housing 55b to a position in which the slide portion 55a does not contact the frame F of the mask M in the operation position W. At this time, the slide portion 55a is housed in the housing 55b by moving in the Z1 direction (upward direction).

Thus, the squeegee 51 and the mask slider 55 are integrally arranged in the squeegee unit 6. The squeegee 51 and the mask slider 55 are integrally moved in the Y direction by movement of the squeegee unit 6. The slide portion 55a of the mask slider 55 supports the mask M by contacting the frame F of the mask M from the Y1 direction side or the Y2 direction side.

(Mask Replacement Unit)

Figure 4A:
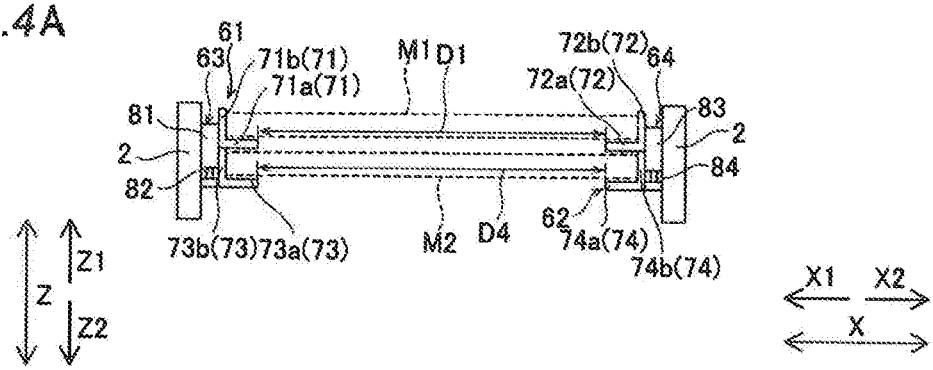
FIG. 4A is a schematic view showing a state in which a first storage and a second storage have been raised by a first elevating unit and a second elevating unit.
Figure 4B:
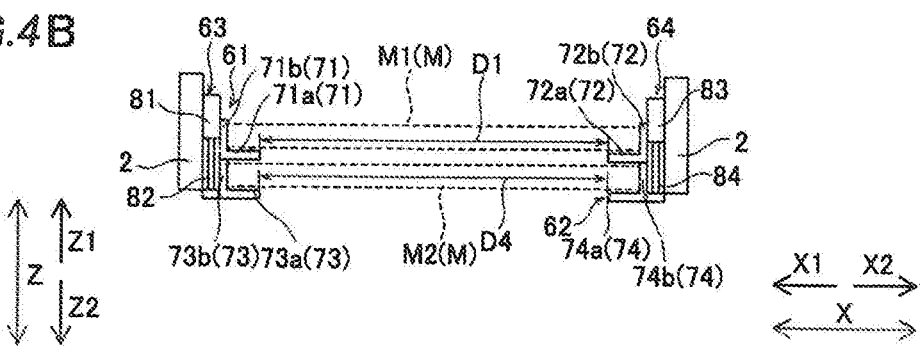
FIG. 4B is a schematic view showing a state in which the first storage and the second storage have been lowered by the first elevating unit and the second elevating unit.
Figure 5:
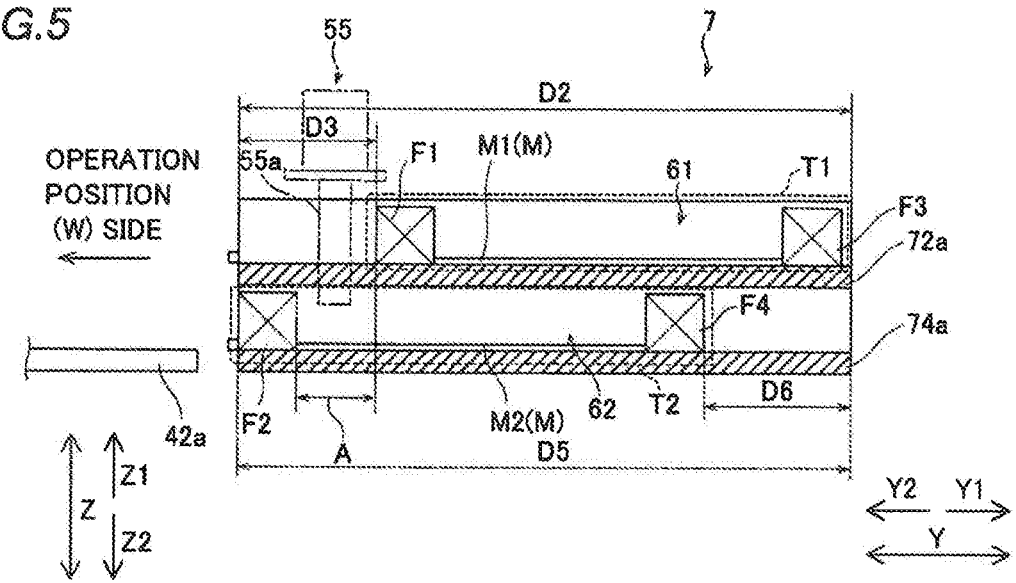
FIG. 5 is a schematic view showing a positional relationship between a first mask stored in the first storage and a second mask stored in the second storage in the printing device according to the first embodiment.

As shown in FIGS. 4A, 4B and 5, the mask replacement unit 7 is configured to store a mask M (hereinafter referred to as a first mask M1) held by the mask clamp member 5, and a mask M (hereinafter referred to as a second mask M2) replaced from the first mask M1 at the predetermined timing. Specifically, the mask replacement unit 7 includes a first storage 61, a second storage 62, a first elevating unit 63, a second elevating unit 64, a first guide rail (not shown), and a second guide rail (not shown). The predetermined timing refers to the timing at which the type of the board B is switched. Information (such as a quick response (QR)) code) indicating the number of boards B on which the solder is to be printed or a different type of board B is imaged by the imager 33 and is read by the controller 9 such that the predetermined timing is recognized. The first elevating unit 63 and the second elevating unit 64 are examples of an "elevating unit" in the claims.

In the mask replacement unit 7, the first elevating unit 63 and the second elevating unit 64 are attached to the base 2. In the mask replacement unit 7, the second storage 62 is attached to the first elevating unit 63. In the mask replacement unit 7, the second storage 62 is attached to the second elevating unit 64. Furthermore, the first storage 61 is attached to the Z1 direction side (upward direction side) of the second storage 62. Thus, the first storage 61 and the second storage 62 move up and down as the first elevating unit 63 and the second elevating unit 64 move up and down.

<First Storage>

The first storage 61 is configured to store the first mask M1 in a first storage position T1. Specifically, the first storage 61 includes a first holder 71 arranged on the X1 direction side and a second holder 72 arranged on the X2 direction side. The first storage 61 supports both ends of the first mask M1 in the X direction from the Z2 direction (downward direction) side by the first holder 71 and the second holder 72. Thus, the first storage 61 holds the first mask M1.

The first holder 71 has a substantially L shape as viewed in the Y direction. That is, the first holder 71 includes a first placement portion 71a configured to allow the first mask M1 to be placed thereon, and a first protrusion 71b that protrudes in the Z1 direction (upward direction) from an end of the first placement portion 71a on the X1 direction side. The second holder 72 has a substantially L shape as viewed in the Y direction. That is, the second holder 72 includes a second placement portion 72a configured to allow the first mask M1 to be placed thereon, and a second protrusion 72b that protrudes in the Z1 direction (upward direction) from an end of the second placement portion 72a on the X2 direction side. Ends of the first placement portion 71a and the second placement portion 72a of the first storage 61 on the Y2 direction side have end faces along the Z direction (upward-downward direction). The first placement portion 71a and the second placement portion 72a are examples of an "upper placement portion" in the claims.

In the first storage 61, an end of the first placement portion 71a of the first holder 71 on the X2 direction side and an end of the second placement portion 72a of the second holder 72 on the X1 direction side are arranged at a first interval D1 (see FIGS. 4A and 4B) in the X direction. Furthermore, as shown in FIG. 5, the first lengths D2 of the first holder 71 and the second holder 72 in the Y direction are set larger than the length of the first mask M1 in the Y direction. Thus, when the first mask M1 is arranged in the first storage position T1 of the first storage 61, a first gap D3 is defined by the first placement portion 71a of the first holder 71 and the second placement portion 72a of the second holder 72 on the Y2 direction side relative to the first mask M1.

<Second Storage>

The second storage 62 is configured to store the second mask M2 in a second storage position T2. Specifically, the second storage 62 includes a third holder 73 arranged on the X1 direction side and a fourth holder 74 arranged on the X2 direction side. The second storage 62 supports both ends of the second mask M2 in the X direction from the Z2 direction (downward direction) side by the third holder 73 and the fourth holder 74. Thus, the second storage 62 holds the second mask M2.

The third holder 73 has a substantially L shape as viewed in the Y direction. That is, the third holder 73 includes a third placement portion 73a configured to allow the second mask M2 to be placed thereon, and a third protrusion 73b that protrudes in the Z1 direction (upward direction) from an end of the third placement portion 73a on the X1 direction side. The fourth holder 74 has a substantially L shape as viewed in the Y direction. That is, the fourth holder 74 includes a fourth placement portion 74a configured to allow the second mask M2 to be placed thereon, and a fourth protrusion 74b that protrudes in the Z1 direction (upward direction) from an end of the fourth placement portion 74a on the X2 direction side. Ends of the third placement portion 73a and the fourth placement portion 74a of the second storage 62 on the Y2 direction side have end faces along the Z direction (upward-downward direction). The third placement portion 73a and the fourth replacement portion 74a are examples of a "lower placement portion" in the claims.

In the first storage 61, an end of the third placement portion 73a of the first holder 71 on the X2 direction side and an end of the second placement portion 72a of the fourth holder 74 on the X1 direction side are arranged at a second interval D4 (see FIGS. 4A and 4B) in the X direction. Furthermore, as shown in FIG. 5, the second lengths D5 of the third holder 73 and the fourth holder 74 in the Y direction are set larger than the length of the second mask M2 in the Y direction. Thus, when the second mask M2 is arranged in the second storage position T2 of the second storage 62, a second gap D6 is defined by the third placement portion 73a of the third holder 73 and the fourth placement portion of the fourth holder 74 on the Y1 direction side relative to the second mask M2.

<First Storage Position and Second Storage Position>

Figure 6A:
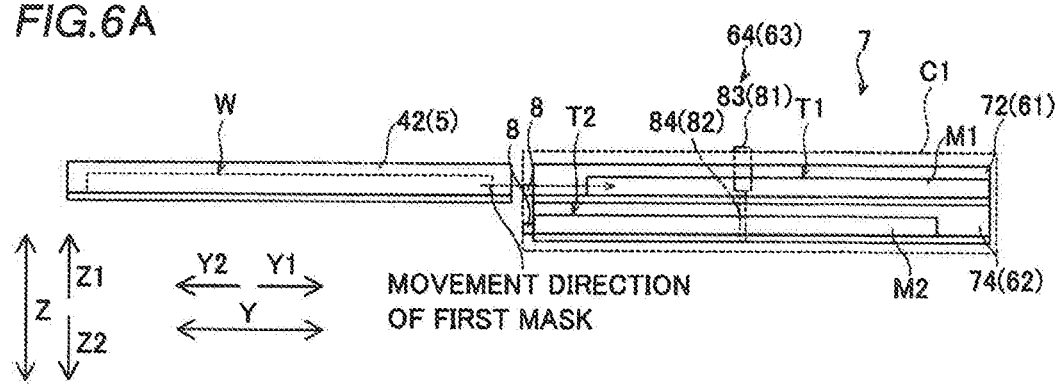
FIG. 6A is a schematic view showing a state in which the first storage is arranged in a first predetermined position.
Figure 6B:
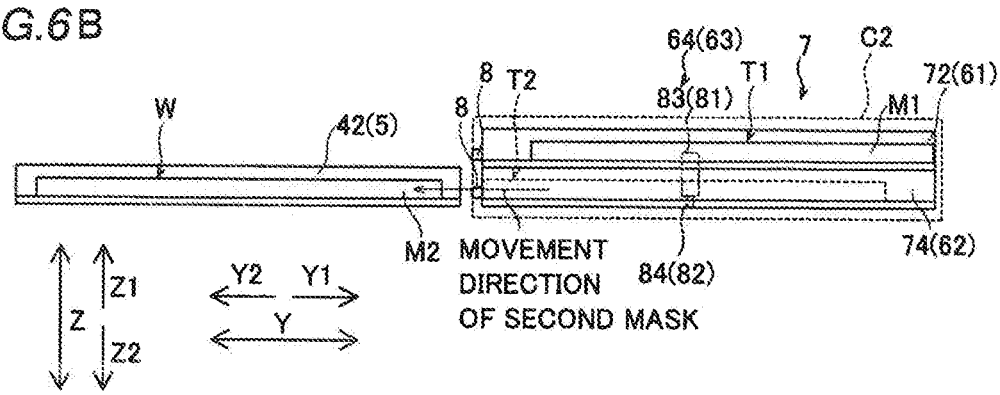
FIG. 6B is a schematic view showing a state in which the second storage is arranged in a second predetermined position.

In the printing device 1 according to the first embodiment, as shown in FIGS. 6A and 6B, the second storage position T2 is displaced from the first storage position T1 so as to enable the mask slider 55 to move the second mask M2 arranged in the second storage 62 in a state in which the first mask M1 is arranged in the first storage position T1. That is, the second storage position T2 is displaced from the first storage position T1 toward the operation position W so as to enable the mask slider 55 to move the second mask M2 to the operation position W in a state in which the first mask M1 is stored in the first storage position T1 of the first storage 61. The mask slider 55 moves the first mask M1 from the operation position W to the first storage position T1 such that the first mask M1 is arranged in the first storage position T1.

The first storage position T1 is an arrangement position of the first mask M1 in the first storage 61. An end of the first storage position T1 on the Y2 direction side is arranged on the Y1 direction side (rear side) relative to an end of the first storage 61 on the Y2 direction side. An end of the first storage position T1 on the Y1 direction side is arranged in the vicinity of an end of the first storage 61 on the Y1 direction side. The second storage position T2 is an arrangement position of the second mask M2 in the second storage 62. An end of the second storage position T2 on the Y2 direction side is arranged in the vicinity of an end of the second storage 62 on the Y2 direction side. An end of the second storage position T2 on the Y1 direction side is arranged on the Y2 direction side (front side) relative to an end of the second storage 62 on the Y1 direction side.

In the mask replacement unit 7, as shown in FIG. 5, the first mask M1 arranged in the first storage position T1 is arranged on the Y1 direction side relative to the second mask M2 arranged in the second storage position T2. That is, the first mask M1 and the second mask M2 are arranged such that a predetermined gap A is made between an end on the Y2 direction side of the frame F on the Y2 direction side of the first mask M1 (hereinafter referred to as a first frame F1 of the first mask M1) and an end on the Y1 direction side of the frame F on the Y2 direction side of the second mask M2 (hereinafter referred to as a first frame F2 of the second mask M2). The predetermined gap A is larger than the width of the slide portion 55a of the mask slider 55 in the Y direction. The predetermined gap A is an example of a "gap configured to allow the mask contact portion to pass therethrough" in the claims. The first frame F1 of the first mask M1 is an example of a "second frame of the first mask" in the claims. The first frame F2 of the second mask M2 is an example of a "second frame of the second mask" in the claims.

Thus, in the mask replacement unit 7, the slide portion 55a of the mask slider 55 is moved downward in a state in which the first mask M1 is stored in the first storage position T1 of the first storage 61 such that the slide portion 55a of the mask slider 55 contacts the first frame F2 of the second mask M2 stored in the second storage position T2 of the second storage 62 through the predetermined gap A.

<First Elevating Unit and Second Elevating Unit>

As shown in FIGS. 4A and 4B, the first elevating unit 63 and the second elevating unit 64 are configured to integrally move the first storage 61 and the second storage 62 up and down. Specifically, the first elevating unit 63 is arranged on the X1 direction side of the base 2. The first elevating unit 63 includes a housing 81 attached to the base 2 and a rod 82 housed in the housing 81 so as to be retractable. The first elevating unit 63 includes an air cylinder. In the first elevating unit 63, the rod 82 moves in the Z direction (upward-downward direction). The second elevating unit 64 is arranged on the X2 direction side of the base 2. The second elevating unit 64 includes a housing 83 attached to the base 2 and a rod 84 housed in the housing 83 so as to be retractable. The second elevating unit 64 includes an air cylinder. In the second elevating unit 64, the rod 84 moves in the Z direction (upward-downward direction).

In the mask replacement unit 7, as shown in FIG. 4B, the rod 82 of the first elevating unit 63 is located at a lower end position, and the rod 84 of the second elevating unit 64 is moved to a lower end position such that the first storage 61 and the second storage 62 are lowered and are arranged in a first predetermined position C1 (see FIG. 6A). In the mask replacement unit 7, as shown in FIG. 4A, the rod 82 of the first elevating unit 63 is moved to an upper end position, and the rod 84 of the second elevating unit 64 is moved to an upper end position such that the first storage 61 and the second storage 62 are raised and are arranged in a second predetermined position C2 (see FIG. 6B).

The first predetermined position C1 indicates a state in which the operation position W and the first storage position T1 are adjacent to each other in the Y direction, as shown in FIG. 6A. That is, the first predetermined position C1 indicates a state in which the first storage 61 and the second storage 62 are moved to lower end positions by the first elevating unit 63 and the second elevating unit 64 in order to move the first mask M1 from the operation position W to the first storage position T1. The second predetermined position C2 indicates a state in which the operation position W and the second storage position T2 are adjacent to each other in the Y direction, as shown in FIG. 6B. That is, the second predetermined position C2 indicates a state in which the first storage 61 and the second storage 62 are moved to upper end positions by the first elevating unit 63 and the second elevating unit 64 in order to move the second mask M2 from the second storage position T2 to the operation position W.

In the first predetermined position C1, the height of the first storage position T1 is substantially the same as the height of the operation position W. In the second predetermined position C2, the height of the second storage position T2 is substantially the same as the height of the operation position W.

(Detection Sensors)

As shown in FIGS. 6A and 6B, the detection sensors 8 are configured to detect at least one of the first mask M1 or the second mask M2 in a state of straddling the mask clamp member 5 and the mask replacement unit 7. Specifically, the detection sensor 8 is configured to detect the first mask M1 stopped in a state of straddling the mask clamp member 5 and the first storage 61 when the first mask M1 is moved from the operation position W to the first storage position T1. The detection sensor 8 is attached to the end of the first storage 61 on the Y2 direction side. Furthermore, the detection sensor 8 is configured to detect the second mask M2 stopped in a state of straddling the mask clamp member 5 and the second storage 62 when the second mask M2 is moved from the second storage position T2 to the operation position W. The detection sensor 8 is attached to the end of the second storage 62 on the Y2 direction side.

A plurality (two sets) of detection sensors 8 are arranged between the mask clamp member 5 and the mask replacement unit 7. Each of the plurality of detection sensors 8 is a transmission-type detection sensor 8, and includes a projector 91 (see FIG. 1) that emits light and a light receiver 92 (see FIG. 1) that receives the light emitted from the projector 91. The projector 91 and the light receiver 92 face each other in the X direction.

(Controller)

As shown in FIG. 7, the controller 9 includes a main control unit 9a, a storage 9b, a drive control unit 9c, an IO control unit 9d, and a camera control unit 9e. The main control unit 9a includes a central processing unit (CPU). The storage 9b includes a read-only memory (ROM), a random access memory (RAM), etc., and stores board data G1, machine data G2, and a printing program. The main control unit 9a has a function of controlling each unit based on the printing program stored in the storage 9b. The board data G1 includes information on the type of the board B, information on the size of the board B, information on the mask M corresponding to the type of the board B, information on the number of boards on which the solder is to be printed for each type of the board B, etc. The machine data G2 includes movement limit positions of the squeegee unit 6 in the X and Y directions, movement limit positions of the camera unit 4 in the X and Y directions, etc.

The main control unit 9a is configured or programmed to control the squeegee unit 6 by the drive control unit 9c. Specifically, the drive control unit 9c controls driving of the squeegee Y-axis drive 52, the squeegee Z-axis drive 53, and the squeegee R-axis drive 54 to move the squeegee 51 in the Y and Z directions and rotate the squeegee 51 about the X-axis direction as a rotation axis.

The main control unit 9a is configured or programmed to control the printing table unit 3 by the drive control unit 9c. Specifically, the main control unit 9a drives the X-axis drive 13, the Y-axis drive 14, the R-axis drive 15, and the Z-axis drive 16 by the drive control unit 9c to move the board B in the X-direction, the Y-direction, and the Z-direction and rotate the board B about the Z-axis direction as a rotation center. Furthermore, the main control unit 9a drives the support plate drive 24 by the drive control unit 9c to move the support plate 23 so as to move the backup pins 23a in the Z direction (upward-downward direction). The main control unit 9a drives the board width axis drive 12a by the drive control unit 9c to adjust the interval (width) between the conveyors 12 in the Y direction. In addition, the main control unit 9a drives a board conveyance axis drive 18 by the drive control unit 9c to convey the board B in the X direction.

The main control unit 9a is configured or programmed to control the camera unit 4 by the drive control unit 9c. Specifically, the main control unit 9a drives the camera X-axis movement mechanism 31 and the camera Y-axis movement mechanism 32 by the drive control unit 9c to move the camera unit 4 in the X and Y directions.

The main control unit 9a is configured or programmed to control the camera unit 4 by the camera control unit 9e. Specifically, the main control unit 9a controls the board B imaging operation of the board camera 33a by the camera control unit 9e. The main control unit 9a controls the mask M imaging operation of the mask camera 33b by the camera control unit 9e.

The main control unit 9a is configured or programmed to control the squeegee unit 6 by the IO control unit 9d. Specifically, the main control unit 9a controls the sliding operation of the slide portion 55a of the mask slider 55 in the Z direction (upward-downward direction) by the IO control unit 9d.

The main control unit 9a is configured or programmed to control the mask replacement unit 7 by the IO control unit 9d. Specifically, the main control unit 9a controls the sliding operation of the rod 82 of the first elevating unit 63 in the Z direction (upward-downward direction) and the sliding operation of the rod 84 of the second elevating unit 64 in the Z direction (upward-downward direction) by the IO control unit 9d. Furthermore, the main control unit 9a is configured or programmed to receive a detection signal of the detection sensor 8 via the IO control unit 9d when the detection sensor 8 detects the first mask M1 stopped in a state of straddling the mask clamp member 5 and the first storage 61. The main control unit 9a is configured or programmed to receive a detection signal of the detection sensor 8 via the IO control unit 9d when the detection sensor 8 detects the second mask M2 stopped in a state of straddling the mask clamp member 5 and the second storage 62.

<Mask Replacement Process>

In the printing device 1, as shown in FIGS. 8A to 8C and 9A to 9C, replacement of the first mask M1 with the second mask M2 is automatically performed by moving the first storage 61 and the second storage 62 up and down in accordance with movement of the mask slider 55. That is, the controller 9 is configured or programmed to perform a mask replacement process, which is an operation to replace the first mask M1 arranged in the operation position W by an operator with the second mask M2.

Figure 8A:
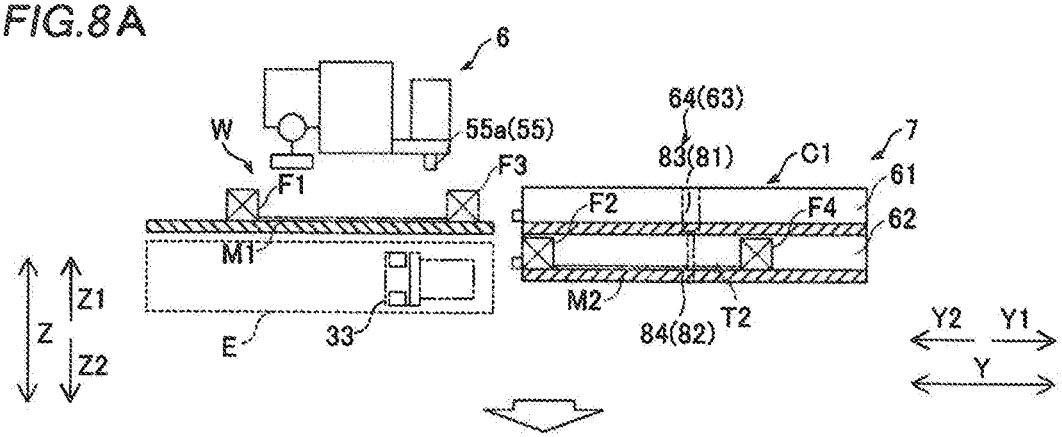
FIG. 8A is a schematic view showing a state in which an imager has been moved to an evacuation region, view

As shown in FIG. 8A, the controller 9 is configured or programmed to lower the first storage 61 and the second storage 62 by the first elevating unit 63 and the second elevating unit 64 based on the imager 33 retracted below the operation position W so as to arrange the first storage 61 in the first predetermined position C1. That is, the controller 9 is configured or programmed to start replacement of the first mask M1 arranged in the operation position W in a state in which the imager 33 is retracted to a position in which interference between the imager 33 and the second storage 62 is avoided. Specifically, the controller 9 is configured or programmed to move the imager 33 to a predetermined position in a retraction region E below the operation position W by the camera X-axis movement mechanism 31 and the camera Y-axis movement mechanism 32 of the camera unit 4. In addition, the controller 9 is configured or programmed to protrude the rod 82 of the first elevating unit 63 and the rod 84 of the second elevating unit 64 from the housings 81 and 83 to the lower end positions based on the imager 33 retracted to the predetermined position in the retraction region E.

Figure 8B:
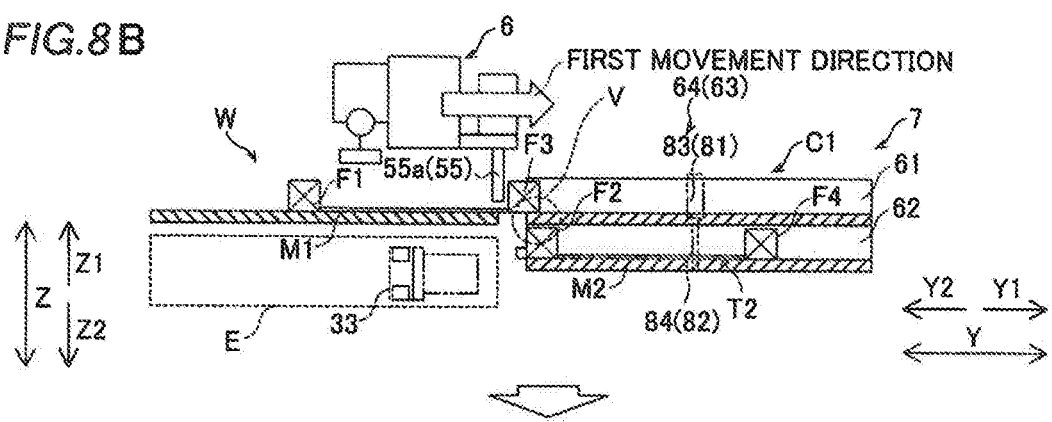
FIG. 8B is a schematic view showing a state in which the first mask is being moved from an operation position to a first storage position, and view

As shown in FIG. 8B, the controller 9 is configured or programmed to bring the slide portion 55a of the mask slider 55 into contact with an end of the frame F on the Y1 direction side of the first mask M1 (hereinafter referred to as a second frame F3 of the first mask M1) in a state in which the slide portion 55a of the mask slider 55 protrudes to a lower end position. The controller 9 is configured or programmed to move the squeegee unit 6 to a movement limit position in a Y1 direction (move the squeegee unit 6 in a first movement direction) in a state in which the slide portion 55a of the mask slider 55 is brought into contact with the end of the second frame F3 of the first mask M1 on the Y2 direction side. At this time, a Y2 direction side portion of the second mask M2 arranged in the second storage 62 and a Y1 direction side portion of the first mask M1 that has moved to a movement limit position overlap each other in a region V. That is, the Y1 direction side portion of the first mask M1 that has moved to the movement limit position overlaps the first storage 61. The second frame F3 of the first mask M1 is an example of a "first frame of the first mask" in the claims.

The controller 9 is configured or programmed to move the mask slider 55 to a position in which the slide portion 55a of the mask slider 55 is brought into contact with the end of the first frame F1 of the first mask M1 on the Y2 direction side in a state in which the slide portion 55a of the mask slider 55 is housed up to an upper end position.

Figure 8C:
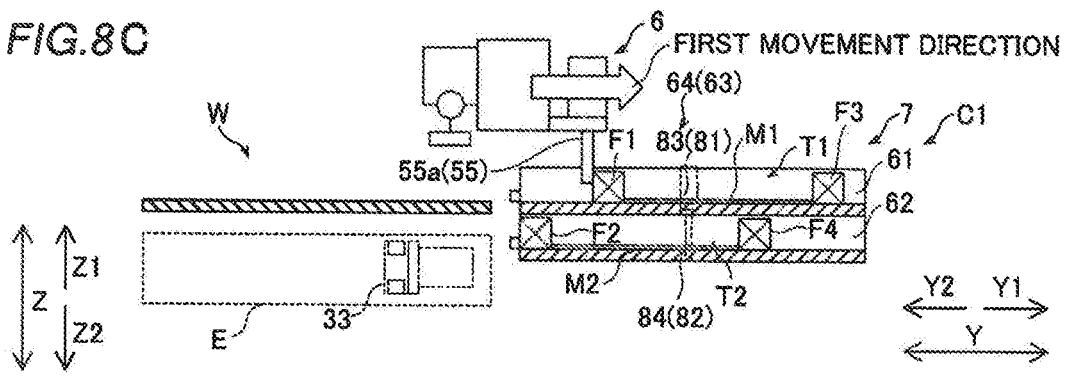
FIG. 8C is a schematic view showing a state in which the first mask is arranged in the first storage position.

As shown in FIG. 8C, the controller 9 is configured or programmed to bring the slide portion 55a of the mask slider 55 into contact with the end of the first frame F1 of the first mask M1 on the Y2 direction side in a state in which the slide portion 55a of the mask slider 55 protrudes to a lower end position based on the squeegee unit 6 moved to the movement limit position in a Y2 direction. The controller 9 is configured or programmed to move the squeegee unit 6 in the Y1 direction and move the first mask M1 to the first storage position T1 in a state in which the slide portion 55a of the mask slider 55 is brought into contact with the end of the first frame F1 of the first mask M1 on the Y2 direction side.

Thus, the controller 9 is configured or programmed to move the first mask M1 in the Y1 direction while bringing the slide portion 55a of the mask slider 55 into contact with the second frame F3 of the first mask M1 in the state of the first predetermined position C1 so as to overlap a portion of the first mask M1 with a portion of the second mask M2, and then store the first mask M1 in the first storage 61 while bringing the slide portion 55a of the mask slider 55 into contact with the first frame F1 of the first mask M1. That is, the controller 9 moves the first mask M1 from the operation position W to the first storage position T1 in a plurality of times by the slide portion 55a of the mask slider 55.

Figure 9A:
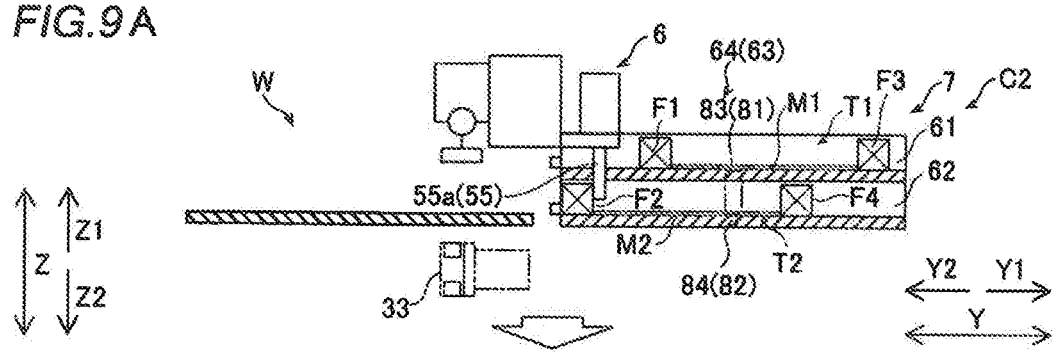
FIG. 9A is a schematic view showing a state in which the second storage is arranged in the second predetermined position, view

As shown in FIG. 9A, the controller 9 is configured or programmed to raise the first storage 61 and the second storage 62 by the first elevating unit 63 and the second elevating unit 64 based on the first mask M1 arranged in the first storage position T1 so as to arrange the second storage 62 in the second predetermined position C2. That is, the controller 9 is configured or programmed to start movement of the second mask M2 arranged in the second storage position T2 to the operation position W. Specifically, the controller 9 is configured or programmed to move the rod 82 of the first elevating unit 63 and the rod 84 of the second elevating unit 64 to the upper end positions and house the rods 82 and 84 in the housings 81 and 83 based on the first mask M1 arranged in the first storage position T1.

The controller 9 is configured or programmed to bring the slide portion 55a of the mask slider 55 into contact with the end of the first frame F2 of the second mask M2 on the Y1 direction side in a state in which the slide portion 55a of the mask slider 55 protrudes to the lower end position. At this time, the controller 9 brings the slide portion 55a of the mask slider 55 into contact with the first frame F2 of the second mask M2 through the predetermined gap A (see FIG. 5) between the first mask M1 and the second mask M2.

Figure 9B:
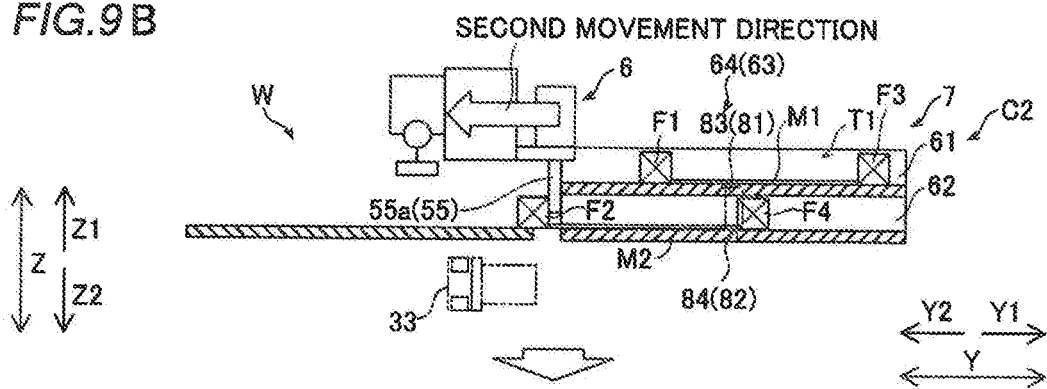
FIG. 9B is a schematic view showing a state in which the second mask is being moved from a second storage position to the operation position.

As shown in FIG. 9B, the controller 9 is configured or programmed to move the squeegee unit 6 to the movement limit position in the Y2 direction (move the squeegee unit 6 in a second movement direction) in a state in which the slide portion 55a of the mask slider 55 is brought into contact with the end of the first frame F2 of the second mask M2 on the Y1 direction side.

The controller 9 is configured or programmed to move the mask slider 55 to a position in which the slide portion 55a of the mask slider 55 is brought into contact with the end of the second frame F4 of the second mask M2 on the Y1 direction side in a state in which the slide portion 55a of the mask slider 55 is housed up to the upper end position.

Figure 9C:
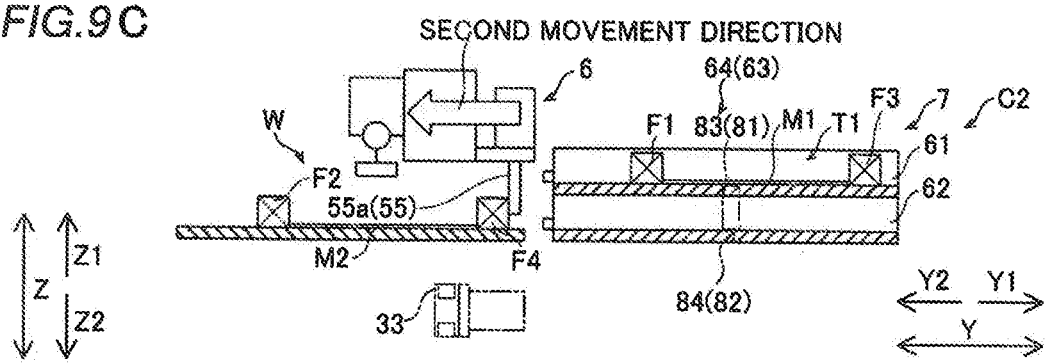
FIG. 9C is a schematic view showing a state in which the second mask is arranged in the operation position.

As shown in FIG. 9C, the controller 9 is configured or programmed to bring the slide portion 55a of the mask slider 55 into contact with the end of the second frame F4 of the second mask M2 on the Y1 direction side in a state in which the slide portion 55a of the mask slider 55 protrudes to the lower end position based on the squeegee unit 6 moved to the movement limit position in the Y1 direction. The controller 9 is configured or programmed to move the squeegee unit 6 in the Y2 direction and move the second mask M2 to the operation position W in a state in which the slide portion 55a of the mask slider 55 is brought into contact with the end of the second frame F4 of the second mask M2 on the Y1 direction side. The second frame F4 of the second mask M2 is an example of a "first frame of the second mask" in the claims.

Thus, the controller 9 is configured or programmed to move the second mask M2 in the Y2 direction while bringing the slide portion 55a of the mask slider 55 into contact with the first frame F2 of the second mask M2 in the state of the second predetermined position C2, and then move the second mask M2 to the operation position W while bringing the slide portion 55a of the mask slider 55 into contact with the second frame F4 of the second mask M2. That is, the controller 9 moves the second mask M2 from the second storage position T2 to the operation position W in a plurality of times by the slide portion 55a of the mask slider 55.

(Flowchart of Mask Replacement Process)

The mask replacement process is now described below with reference to FIG. 10. The mask replacement process is a process to perform replacement by storing the first mask M1 arranged in the operation position W in the first storage 61 and then arranging the second mask M2 stored in the second storage 62 in the operation position W.

Figure 10:
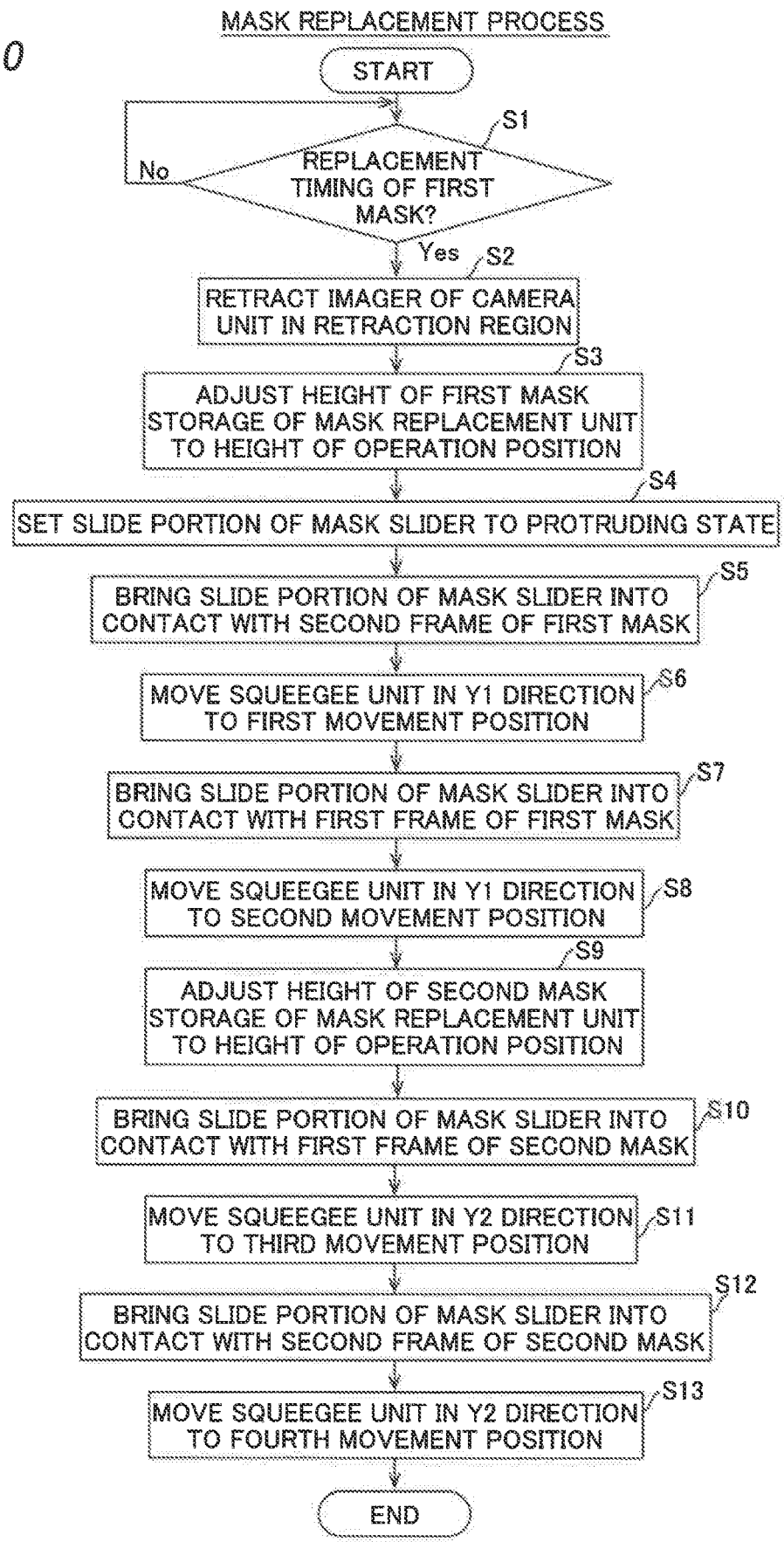
FIG. 10 is a flowchart of a mask replacement process of the printing device according to the first embodiment.

As shown in FIG. 10, in step S1, the controller 9 determines whether or not it is the replacement timing of the first mask M1 placed in the operation position W. The controller 9 advances to step S2 when it is the replacement timing, and returns to step S1 when it is not the replacement timing. In step S2, in the printing device 1, the controller 9 retracts the imager 33 of the camera unit 4 in the retraction region E. In step S3, in the printing device 1, the controller 9 adjusts the height of the first storage 61 of the mask replacement unit 7 to the height of the operation position W. That is, the controller 9 adjusts the height of the first storage 61 of the mask replacement unit 7 to the height of the operation position W by the first elevating unit 63 and the second elevating unit 64, and moves the first storage 61 in the Z2 direction (downward direction).

In step S4, in the printing device 1, after adjusting the height of the first storage 61 to the height of the operation position W, the controller 9 sets the slide portion 55a of the mask slider 55 to a protruding state. In step S5, in the printing device 1, the controller 9 brings the slide portion 55a of the mask slider 55 into contact with the second frame F3 of the first mask M1 while keeping the slide portion 55a of the mask slider 55 in the protruding state. In step S6, in the printing device 1, the controller 9 moves the squeegee unit 6 in the Y1 direction to a first movement position (movement limit position) in a state in which the slide portion 55a of the mask slider 55 and the second frame F3 of the first mask M1 are brought into contact with each other.

In step S7, in the printing device 1, after moving the squeegee unit 6 in the Y1 direction to the first movement position, the controller 9 brings the slide portion 55a of the mask slider 55 into contact with the first frame F1 of the first mask M1. In step S8, in the printing device 1, the controller 9 moves the squeegee unit 6 in the Y1 direction to a second movement position (a position for arranging the first mask M1 in the first storage position T1) in a state in which the slide portion 55a of the mask slider 55 and the first frame F1 of the first mask M1 are brought into contact with each other.

In step S9, in the printing device 1, the controller 9 adjusts the height of the second storage 62 of the mask replacement unit 7 to the height of the operation position W. That is, the controller 9 adjusts the height of the second storage 62 of the mask replacement unit 7 to the height of the operation position W by the first elevating unit 63 and the second elevating unit 64, and moves the second storage 62 in the Z1 direction (upward direction).

In step S10, in the printing device 1, after adjusting the height of the second storage 62 to the height of the operation position W, the controller 9 brings the slide portion 55a of the mask slider 55 into contact with the first frame F2 of the second mask M2. In step S11, in the printing device 1, the controller 9 moves the squeegee unit 6 in the Y2 direction to a third movement position (movement limit position) in a state in which the slide portion 55a of the mask slider 55 and the first frame F2 of the second mask M2 are brought into contact with each other.

In step S12, in the printing device 1, after moving the squeegee unit 6 in the Y2 direction to the third movement position, the controller 9 brings the slide portion 55a of the mask slider 55 into contact with the second frame F4 of the second mask M2. In step S13, in the printing device 1, the controller 9 moves the squeegee unit 6 to a fourth movement position (operation position W) in the Y2 direction in a state in which the slide portion 55a of the mask slider 55 and the second frame F4 of the second mask M2 are brought into contact with each other, and then the mask replacement process is terminated.

Advantageous Effects of First Embodiment

According to the first embodiment, the following advantageous effects are achieved.

According to the first embodiment, as described above, the second storage position T2 is displaced from the first storage position T1 so as to enable the mask slider 55 to move the second mask M2 arranged in the second storage 62 in a state in which the first mask M1 is arranged in the first storage position T1 by movement of the first mask M1 from the operation position W to the first storage position t1 by the mask slider 55 including the slide portion 55a. Accordingly, even when the first mask M1 is arranged in the first storage position T1, the slide portion 55a of the mask slider 55 can be brought into contact with the second mask M2 in the position displaced from the first storage position T1. Therefore, the second mask M2 stored in the second storage position T2 can be moved by the mask slider 55 without using a structure other than the mask slider 55 such as a belt conveyor to move the second mask M2 from the second storage position T2, and thus an increase in the size of the printing device 1 due to an increase in the size of the mask replacement unit 7 can be significantly reduced or prevented. Furthermore, the mask slider 55 can directly move the first mask M1 arranged in the operation position W to the first storage position T1 of the first storage 61 and can directly move the second mask M2 arranged in the second storage position T2 to the operation position W, and thus as compared with a structure in which the first mask M1 or the second mask M2 is moved between the operation position W and the first storage position T1 or the second storage position T2 by a transfer means including a belt conveyor, an increase in the size of the printing device 1 due to an increase in the size of the mask replacement unit 7 can be significantly reduced or prevented.

According to the first embodiment, as described above, the first storage 61 is arranged above the second storage 62. Furthermore, the second storage position T2 is displaced from the first storage position T1 toward the operation position W so as to enable the mask slider 55 to move the second mask M2 to the operation position W in a state in which the first mask M1 is stored in the first storage position T1 of the first storage 61. Accordingly, after the first mask M1 is stored in the first storage position T1, the mask slider 55 can easily access the second mask M2 arranged in the second storage position T2 from above, and thus a complex structure of the printing device 1 can be significantly reduced or prevented.

According to the first embodiment, as described above, the mask replacement unit 7 is configured to bring the slide portion 55a of the mask slider 55 into contact with the second frame F4 of the second mask M2 stored in the second storage position T2 of the second storage 62 through the predetermined gap A by moving the slide portion 55a of the mask slider 55 downward in a state in which the first mask M1 is stored in the first storage position T1 of the first storage 61. Accordingly, the predetermined gap A is simply provided in the first storage 61 such that after the first mask M1 is stored in the first storage position T1, the slide portion 55a of the mask slider 55 can access the second mask M2 arranged in the second storage position T2. Therefore, a complex structure of the printing device 1 can be significantly reduced or prevented.

According to the first embodiment, as described above, the printing device 1 includes the imager 33 that is arranged in the region between the printing position (ends of the conveyors 12 on the Z1 direction side) and the operation position W and is movable in the horizontal direction. Furthermore, the mask replacement unit 7 further includes the first elevating unit 63 and the second elevating unit 64 that move the first storage 61 and the second storage 62 up and down to the first predetermined position C1 and the second predetermined position C2. In addition, the controller 9 is configured or programmed to lower the first storage 61 and the second storage 62 by the first elevating unit 63 and the second elevating unit 64 based on the imager 33 retracted below the operation position W so as to arrange the first storage 61 in the first predetermined position C1. Accordingly, even when the second storage 62 and the imager 33 are arranged close to each other to an interference position, interference between the second storage 62 and the imager 33 can be prevented, and thus the printing device 1 can be downsized.

According to the first embodiment, as described above, the controller 9 is configured or programmed to move the first mask M1 toward the first storage position T1 while bringing the slide portion 55a of the mask slider 55 into contact with the second frame F3 of the first mask M1 in the state of the first predetermined position C1 so as to overlap a portion of the first mask M1 with a portion of the second mask M2, and then store the first mask M1 in the first storage 61 while bringing the slide portion 55a of the mask slider 55 into contact with the first frame F1 of the first mask M1. Furthermore, the controller 9 is configured or programmed to move the second mask M2 toward the operation position W while bringing the slide portion 55a of the mask slider 55 into contact with the second frame F4 of the second mask M2 in the state of the second predetermined position C2, and then move the second mask M2 toward the operation position W while bringing the slide portion 55a of the mask slider 55 into contact with the first frame F2 of the second mask M2. Accordingly, unlike a case in which a plurality of slide portions 55a are used, a movement range is effectively utilized using the single slide portion 55a such that the first mask M1 can be stored in the first storage 61, and the second mask M2 can be moved from the second storage 62 to the operation position W. Thus, a complex structure of the printing device 1 can be further significantly reduced or prevented.

According to the first embodiment, as described above, the first storage 61 and the second storage 62 respectively include the first placement portion 71a configured to allow the first mask M1 to be placed thereon and the second placement portion 72a configured to allow the second mask M2 to be placed thereon. Furthermore, the printing device 1 further includes the detection sensors 8 arranged between the first and second supports 41a and 42a and the mask replacement unit 7 and configured to detect a state in which at least one of the first mask M1 or the second mask M2 straddles the first support 41a, the second support 42a, and the mask replacement unit 7. Accordingly, the detection sensors 8 can detect a state in which at least one of the first mask M1 or the second mask M2 straddles the mask clamp member 5 and the mask replacement unit 7, and thus the occurrence of a state (inconvenience) in which the printing device 1 continues to work while at least one of the first mask M1 or the second mask M2 straddles the mask clamp member 5 and the mask replacement unit 7 can be significantly reduced or prevented.

According to the first embodiment, as described above, the squeegee 51 and the mask slider 55 are integrally arranged in the squeegee unit 6. Furthermore, the controller 9 is configured or programmed to integrally move the squeegee 51 and the mask slider 55 as the squeegee unit 6 moves. Accordingly, the printing device 1 can be downsized as compared with a case in which the squeegee 51 and the mask slider 55 are provided separately.

Second Embodiment

The structure of a printing device 201 according to a second embodiment of the present disclosure is now described with reference to FIGS. 1, 11, and 12. In the second embodiment, an example is described in which in a first predetermined position C1, the height of a first storage position T1 is lower than the height of an operation position W, and in a second predetermined position C2, the height of a second storage position T2 is higher than the height of the operation position W, unlike the first embodiment in which the height of the operation position W and the height of the first storage position T1 are substantially the same as each other in the first predetermined position C1, and the height of the operation position W and the height of the second storage position T2 are substantially the same as each other in the second predetermined position C2. In the second embodiment, the same or similar structures as those of the first embodiment are denoted by the same reference numerals, and description thereof is omitted.

<Mask Replacement Process>

Figure 11:
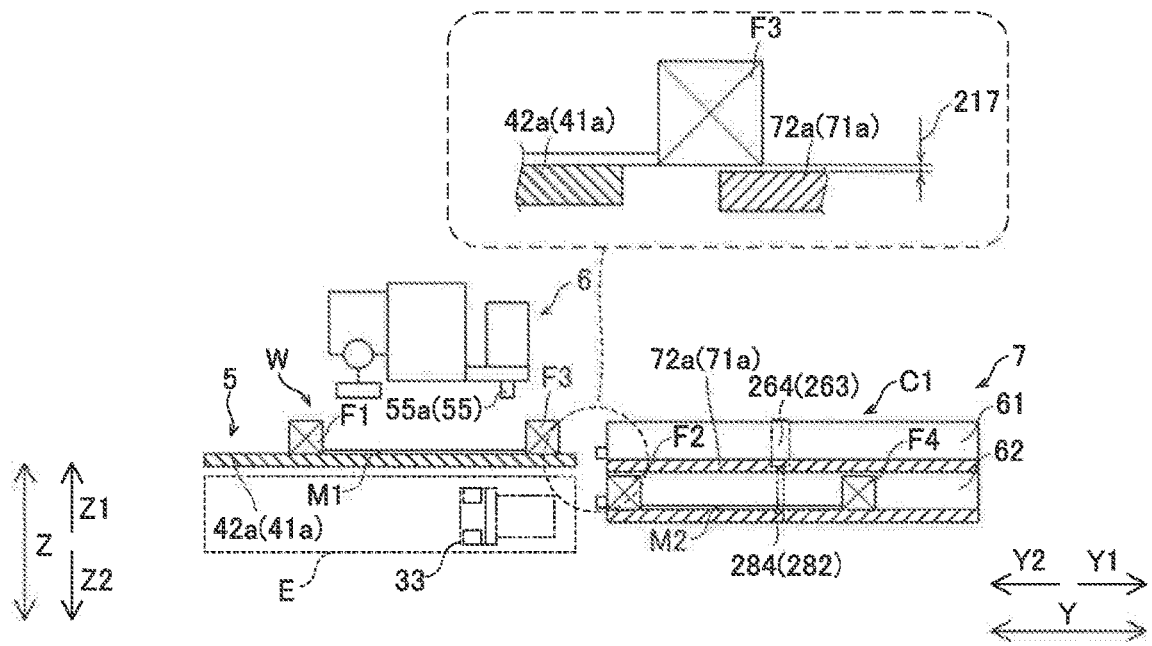
FIG. 11 is a schematic view showing a state in which a first mask is moved from an operation position to a first storage position in a printing device according to a second embodiment.
Figure 12:
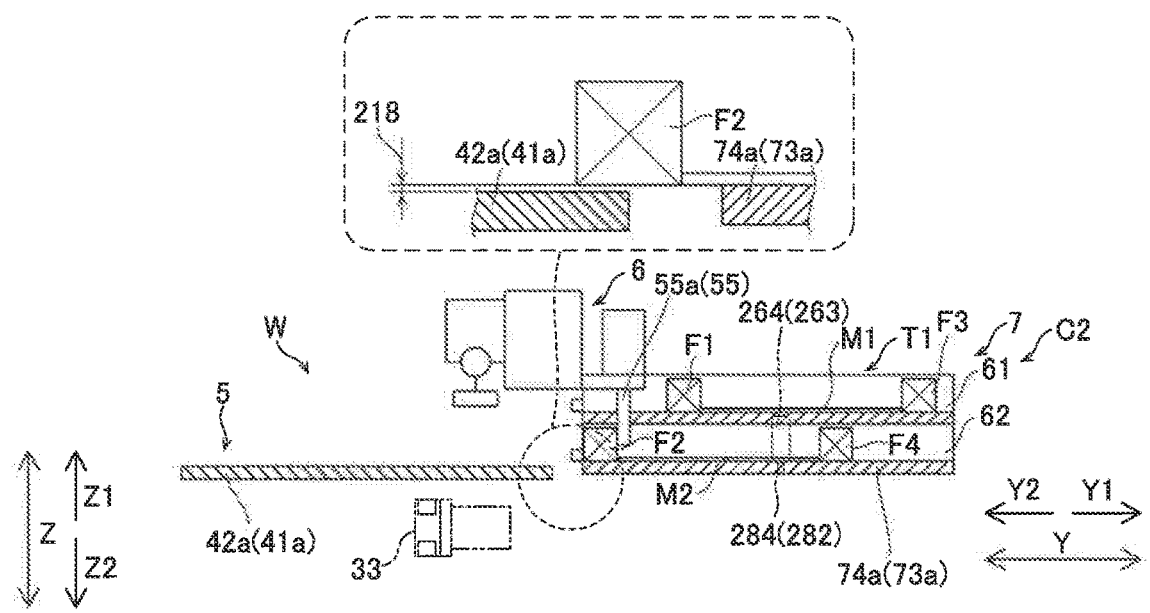
FIG. 12 is a schematic view showing a state in which a second mask is moved from a second storage position to the operation position in the printing device according to the second embodiment.

In a printing device 201, as shown in FIGS. 11 and 12, replacement of a first mask M1 with a second mask M2 is automatically performed by moving a first storage 61 and a second storage 62 up and down in accordance with movement of a mask slider 55.

As shown in FIG. 11, a controller 9 is configured or programmed to lower the first storage 61 and the second storage 62 by a first elevating unit 263 and a second elevating unit 264 based on an imager 33 retracted below the operation position W so as to arrange the first storage 61 in the first predetermined position C1. At this time, a rod 282 of the first elevating unit 263 and a rod 284 of the second elevating unit 264 protrude from housings 81 and 83 to lower end positions such that the positions of a first placement portion 71a and a second placement portion 72a of the first storage 61 in a height direction are on the Z2 direction side (downward direction side) relative to the positions of a first support 41a and a second support 42a of a mask clamp member 5 in the height direction. That is, a first step 217 is provided between the first support 41a and the second support 42a of the mask clamp member 5 and the first placement portion 71a and the second placement portion 72a of the first storage 61.

As shown in FIG. 12, the controller 9 is configured or programmed to raise the first storage 61 and the second storage 62 by the first elevating unit 263 and the second elevating unit 264 based on the first mask M1 arranged in the first storage position T1 so as to arrange the second storage 62 in the second predetermined position C2. At this time, the rod 282 of the first elevating unit 263 and the rod 284 of the second elevating unit 264 are housed in the housings 81 and 83 up to upper end positions such that the positions of a third placement portion 73a and a fourth placement portion 74a of the second storage 62 in the height direction are on the Z1 direction side (upward direction side) relative to the positions of the first support 41a and the second support 42a of the mask clamp member 5 in the height direction. That is, a second step 218 is provided between the first support 41a and the second support 42a of the mask clamp member 5 and the first placement portion 71a and the second placement portion 72a of the first storage 61.

Thus, the controller 9 is configured or programmed to arrange the first placement portion 71a and the second placement portion 72a on the Z2 direction side (downward direction side) relative to the first support 41a and the second support 42a based on movement of the first mask M1 in a Y1 direction. Furthermore, the controller 9 is configured or programmed to arrange the third placement portion 73a and the fourth placement portion 74a on the Z1 direction side (upward direction side) relative to the first support 41a and the second support 42a based on movement of the second mask M2 in a Y2 direction. The remaining structures of the second embodiment are similar to those of the first embodiment.

Advantageous Effects of Second Embodiment

According to the second embodiment, the following advantageous effects are achieved.

According to the second embodiment, as described above, the controller 9 is configured or programmed to arrange the first replacement portion 71a on the Z2 direction side (downward direction side) relative to the first support 41a and the second support 42a based on movement of the first mask M1 in the Y1 direction from the operation position W toward the mask replacement unit 7, and arrange the second placement portion 72a on the Z1 direction side (upward direction side) relative to the first support 41a and the second support 42a based on movement of the second mask M2 in a direction (Y2 direction) opposite to the Y1 direction. Accordingly, when the first mask M1 moves from the operation position W to the first storage position T1, the first mask M1 is unlikely to be caught at ends of the first placement portion 71a and the second placement portion 72a on the operation position W side, and when the second mask M2 moves from the second storage position T2 to the operation position W, the second mask M2 is unlikely to be caught at ends of the first support 41a and the second support 42a on the second storage 62 side. Thus, movement of the first mask M1 from the operation position W to the first storage position T1 and movement of the second mask M2 from the second storage position T2 to the operation position W can be stably performed. The remaining advantageous effects of the second embodiment are similar to those of the first embodiment.

Modified Examples

The embodiments disclosed this time must be considered as illustrative in all points and not restrictive. The scope of the present disclosure is not shown by the above description of the embodiments but by the scope of claims for patent, and all modifications (modified examples) within the meaning and scope equivalent to the scope of claims for patent are further included.

Figure 13:
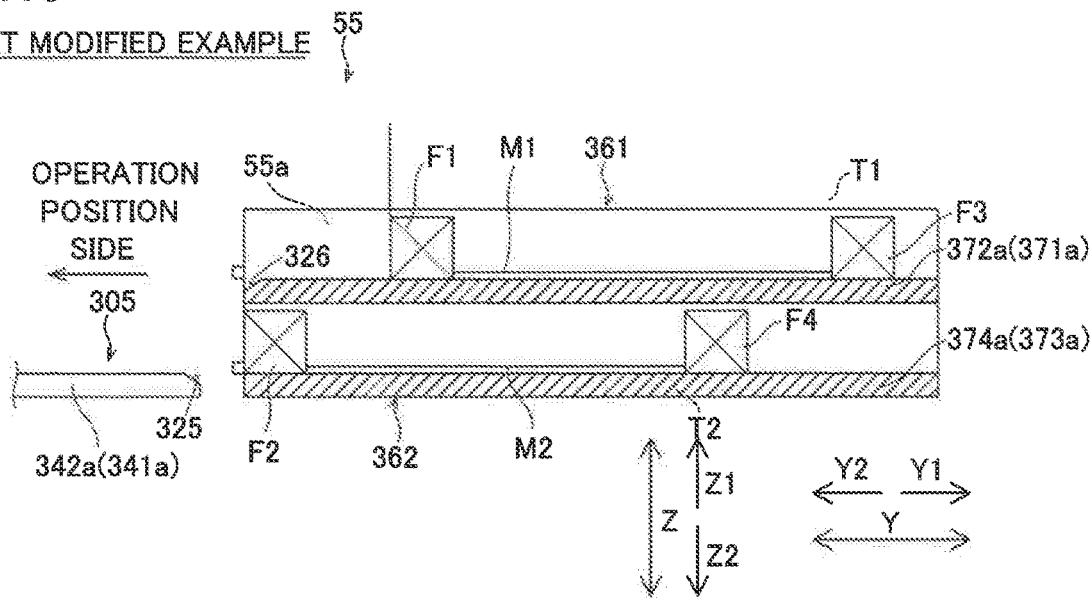
FIG. 13 is a schematic view showing a mask clamp member, a first storage, and a second storage in a printing device according to a first modified example.

For example, while the example in which the ends of the first support 41a and the second support 42a of the mask clamp member 5 on the Y1 direction side have the end faces along the Z direction (upward-downward direction) has been shown in each of the aforementioned first and second embodiments, the present disclosure is not restricted to this. In the present disclosure, as in a first modified example shown in FIG. 13, ends of a first support 341a and a second support 342a of a mask clamp member 305 on the Y1 direction side may have inclined surfaces 325 inclined in a Z2 direction (downward direction) toward a mask replacement unit 7. Thus, the ends of the first support 341a and the second support 342a of the mask clamp member 305 on the mask replacement unit 7 side are inclined downward toward the mask replacement unit 7. Accordingly, when a second mask M2 is moved from a second storage position T2 to an operation position W, the second mask M2 is unlikely to be caught by the mask clamp member 305 due to the inclination of the first support 41a and the second support 42a of the mask clamp member 305, and thus movement of the second mask M2 from the second storage position T2 to the operation position W can be more stably performed.

While the example in which the ends of the first placement portion 71a and the second placement portion 72a of the first storage 61 on the Y2 direction side have the end faces along the Z direction (upward-downward direction) has been shown in each of the aforementioned first and second embodiments, the present disclosure is not restricted to this. In the present disclosure, as in the first modified example shown in FIG. 13, ends of a first placement portion 371a and a second placement portion 372a of a first storage 361 on the Y2 direction side may have inclined surfaces 326 inclined in the Z2 direction (downward direction) toward the mask clamp member 305. Thus, the first placement portion 371a of the first storage 361 is inclined downward toward the mask clamp member 305. Accordingly, when a first mask M1 is moved from the operation position W to a first storage position T1, the first mask M1 is unlikely to be caught by the first storage 61 due to the inclination of the first placement portion 371a and the second placement portion 372a, and thus movement of the first mask M1 from the operation position W to the first storage position T1 can be more stably performed.

While the example in which the controller 9 is configured or programmed to move the squeegee unit 6 to the movement limit position in the Y1 direction in a state in which the slide portion 55a of the mask slider 55 is brought into contact with the end of the second frame F3 of the first mask M1 on the Y2 direction side has been shown in each of the aforementioned first and second embodiments, the present disclosure is not restricted to this. In the present disclosure, the controller may be configured or programmed not to move the squeegee unit to the movement limit position in the Y1 direction in a state in which the cylinder of the mask slider is brought into contact with the end of the second frame of the first mask on the Y2 direction side.

While the example in which the controller 9 is configured or programmed to move the squeegee unit 6 to the movement limit position in the Y2 direction in a state in which the slide portion 55a of the mask slider 55 is brought into contact with the end of the first frame F2 of the second mask M2 on the Y1 direction side has been shown in each of the aforementioned first and second embodiments, the present disclosure is not restricted to this. In the present disclosure, the controller may be configured or programmed not to move the squeegee unit to the movement limit position in the Y2 direction in a state in which the cylinder of the mask slider is brought into contact with the end of the first frame of the second mask on the Y1 direction side.

While the example in which the mask replacement unit 7 includes the first storage 61 and the second storage 62 has been shown in each of the aforementioned first and second embodiments, the present disclosure is not restricted to this. In the present disclosure, the mask replacement unit may include three or more storages.

While the example in which the first storage 61 is arranged on the Z1 direction side (upward direction side) of the second storage 62 has been shown in each of the aforementioned first and second embodiments, the present disclosure is not restricted to this. In the present disclosure, the first storage and the second storage may be aligned in the X direction or the Y direction. Alternatively, the first storage may be arranged on the Z2 direction side (downward direction side) of the second storage.

While the example in which the first elevating unit 63 and the second elevating unit 64 each including an air cylinder move the first storage 61 and the second storage 62 up and down has been shown in each of the aforementioned first and second embodiments, the present disclosure is not restricted to this. In the present disclosure, a first elevating unit and a second elevating unit including each a servo motor may move the first storage and the second storage up and down.

While the example in which the mask slider 55 is arranged integrally with the squeegee 51 in the squeegee unit 6 has been shown in each of the aforementioned first and second embodiments, the present disclosure is not restricted to this. In the present disclosure, the mask slider may be provided separately from the squeegee unit.

While the example in which the detection sensors 8 are transmissive sensors has been shown in each of the aforementioned first and second embodiments, the present disclosure is not restricted to this. In the present disclosure, the detection sensors may be contact-type touch sensors.

Figure 14:
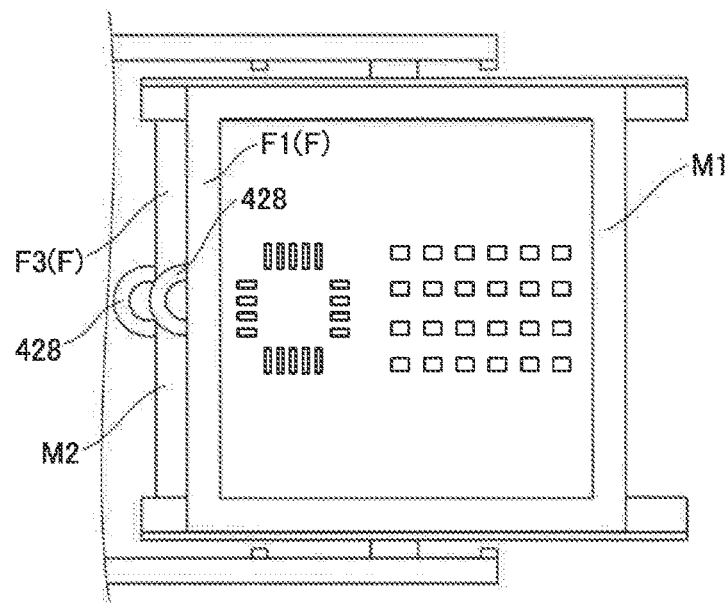
FIG. 14 is a plan view showing a state in which a first mask and a second mask overlap each other in an upward-downward direction in a printing device according to a second modified example.

While the example in which the slide portion 55a of the mask slider 55 contacts the frame F of each of the first mask M1 and the second mask M2 to move the first mask M1 or the second mask M2 has been shown in each of the aforementioned first and second embodiments, the present disclosure is not restricted to this. In the present disclosure, as in a second modified example shown in FIG. 14, a hook 428 may be provided in each of first frames F1 and F2 of a first mask M1 and a second mask M2. In this case, even when a predetermined gap A is not formed between the first frame F1 of the first mask M1 and the first frame F2 of the second mask M2, a slide portion 55a of a mask slider 55 is hooked on the hook 428 such that the first mask M1 or the second mask M2 can be moved. Alternatively, instead of the hook 428, an engagement hole with which the slide portion 55a of the mask slider 55 engages may be formed on the upper surface of the frame F.

While the example in which the mask slider 55 is an air cylinder has been shown in each of the aforementioned first and second embodiments, the present disclosure is not restricted to this. In the present disclosure, the mask slider may be a hook or a chuck mechanism using a magnetic force or air pressure other than the air cylinder, for example.

While the process operations performed by the controller 9 are described, using the flow described in a manner driven by a flow in which processes are performed in order along a process flow for the convenience of illustration in each of the aforementioned first and second embodiments, the present disclosure is not restricted to this. In the present disclosure, the process operations performed by the controller may be performed in an event-driven manner in which processes are performed on an event basis. In this case, the process operations may be performed in a complete event-driven manner or in a combination of an event-driven manner and a manner driven by a flow.

What is claimed is:

1. A printing device comprising:
a squeegee configured to print, on a board arranged in a printing position, a coating material on a first mask arranged in an operation position;
a moving member including a mask contact portion configured to contact the first mask, the moving member being configured to move the first mask while bringing the mask contact portion into contact with the first mask; and
a mask replacement unit including a first storage configured to store the first mask in a first storage position and a second storage configured to store, in a second storage position, a second mask replaced with the first mask and arranged in the operation position; wherein
the first storage is arranged above the second storage, and the second storage position is displaced from the first storage position in a plan view so as to enable the moving member to move the second mask arranged in the second storage in a state in which the first mask is arranged in the first storage position by movement of the first mask from the operation position to the first storage position by the moving member.

2. The printing device according to claim 1, wherein the second storage position is displaced from the first storage position toward the operation position so as to enable the moving member to move the second mask to the operation position in a state in which the first mask is stored in the first storage position of the first storage.

3. The printing device according to claim 2, wherein the mask contact portion is movable in an upward-downward direction;
each of the first mask and the second mask includes a first frame provided at an end thereof in a first movement direction from the operation position toward the mask replacement unit, and a second frame provided at an end thereof in a direction opposite to the first movement direction;
the first storage includes a gap formed on at least a side of the operation position relative to the first storage position, the gap being configured to allow the mask contact portion of the moving member to pass therethrough; and
the mask replacement unit is configured to bring the mask contact portion into contact with the second frame of the second mask stored in the second storage position of the second storage through the gap by moving the mask contact portion downward in a state in which the first mask is stored in the first storage position of the first storage.

4. The printing device according to claim 3, further comprising:
an imager arranged in a region between the printing position and the operation position, the imager being movable in a horizontal direction; wherein
the mask replacement unit further includes an elevating unit configured to move the first storage and the second storage up and down to a first predetermined position in which the operation position and the first storage position are adjacent to each other, and to a second predetermined position in which the operation position and the second storage position are adjacent to each other; and
the elevating unit is configured to lower the first storage and the second storage based on the imager retracted below the operation position so as to arrange the first storage in the first predetermined position.

5. The printing device according to claim 3, further comprising:
a mask support configured to support the first mask or the second mask from below in the operation position; wherein
the first storage and the second storage respectively include an upper placement portion configured to allow the first mask to be placed thereon and a lower placement portion configured to allow the second mask to be placed thereon;
the upper placement portion is arranged below the mask support based on movement of the first mask in a first movement direction from the operation position toward the mask replacement unit; and
the lower placement portion is arranged above the mask support based on movement of the second mask in a second movement direction opposite to the first movement direction.

6. The printing device according to claim 3, wherein the squeegee and the moving member are integrally arranged in a squeegee unit; and
the squeegee and the moving member are configured to integrally move as the squeegee unit moves.

7. The printing device according to claim 2, further comprising:
an imager arranged in a region between the printing position and the operation position, the imager being movable in a horizontal direction; wherein
the mask replacement unit further includes an elevating unit configured to move the first storage and the second storage up and down to a first predetermined position in which the operation position and the first storage position are adjacent to each other, and to a second predetermined position in which the operation position and the second storage position are adjacent to each other; and
the elevating unit is configured to lower the first storage and the second storage based on the imager retracted below the operation position so as to arrange the first storage in the first predetermined position.

8. The printing device according to claim 2, further comprising:
a mask support configured to support the first mask or the second mask from below in the operation position; wherein
the first storage and the second storage respectively include an upper placement portion configured to allow the first mask to be placed thereon and a lower placement portion configured to allow the second mask to be placed thereon;
the upper placement portion is arranged below the mask support based on movement of the first mask in a first movement direction from the operation position toward the mask replacement unit; and
the lower placement portion is arranged above the mask support based on movement of the second mask in a second movement direction opposite to the first movement direction.

9. The printing device according to claim 2, wherein the squeegee and the moving member are integrally arranged in a squeegee unit; and
the squeegee and the moving member are configured to integrally move as the squeegee unit moves.

10. The printing device according to claim 1, further comprising:
an imager arranged in a region between the printing position and the operation position, the imager being movable in a horizontal direction; wherein
the mask replacement unit further includes an elevating unit configured to move the first storage and the second storage up and down to a first predetermined position in which the operation position and the first storage position are adjacent to each other, and to a second predetermined position in which the operation position and the second storage position are adjacent to each other; and
the elevating unit is configured to lower the first storage and the second storage based on the imager retracted below the operation position so as to arrange the first storage in the first predetermined position.

11. The printing device according to claim 10, wherein the mask contact portion provided in the moving member is a single portion;
each of the first mask and the second mask includes a first frame provided at an end thereof in a first movement direction from the operation position toward the mask replacement unit, and a second frame provided at an end thereof in a direction opposite to the first movement direction;

the first mask is configured to be moved in the first movement direction while the mask contact portion is brought into contact with the first frame of the first mask in a state of the first predetermined position so as to overlap a portion of the first mask with a portion of the second mask, and then be stored in the first storage while the mask contact portion is brought into contact with the second frame of the first mask; and the second mask is configured to be moved in a direction opposite to the first movement direction while the mask contact portion is brought into contact with the second frame of the second mask in a state of the second predetermined position, and then be moved to the operation position while the mask contact portion is brought into contact with the first frame of the second mask.

12. The printing device according to claim 11, further comprising:

a mask support configured to support the first mask or the second mask from below in the operation position; wherein the first storage and the second storage respectively include an upper placement portion configured to allow the first mask to be placed thereon and a lower placement portion configured to allow the second mask to be placed thereon;

the upper placement portion is arranged below the mask support based on movement of the first mask in a first movement direction from the operation position toward the mask replacement unit; and the lower placement portion is arranged above the mask support based on movement of the second mask in a second movement direction opposite to the first movement direction.

13. The printing device according to claim 11, wherein the squeegee and the moving member are integrally arranged in a squeegee unit; and the squeegee and the moving member are configured to integrally move as the squeegee unit moves.

14. The printing device according to claim 10, further comprising:

a mask support configured to support the first mask or the second mask from below in the operation position; wherein the first storage and the second storage respectively include an upper placement portion configured to allow the first mask to be placed thereon and a lower placement portion configured to allow the second mask to be placed thereon;

the upper placement portion is arranged below the mask support based on movement of the first mask in a first movement direction from the operation position toward the mask replacement unit; and the lower placement portion is arranged above the mask support based on movement of the second mask in a second movement direction opposite to the first movement direction.

15. The printing device according to claim 10, wherein the squeegee and the moving member are integrally arranged in a squeegee unit; and the squeegee and the moving member are configured to integrally move as the squeegee unit moves.

16. The printing device according to claim 1, further comprising:

a mask support configured to support the first mask or the second mask from below in the operation position; wherein the first storage and the second storage respectively include an upper placement portion configured to allow the first mask to be placed thereon and a lower placement portion configured to allow the second mask to be placed thereon;

the upper placement portion is arranged below the mask support in case that movement of the first mask in a first movement direction from the operation position toward the mask replacement unit; and the lower placement portion is arranged above the mask support in case that movement of the second mask in a second movement direction opposite to the first movement direction.

17. The printing device according to claim 16, wherein an end of the mask support on a side of the mask replacement unit is inclined downward toward the mask replacement unit; and at least one of the upper placement portion of the first storage or the lower placement portion of the second storage is inclined downward toward the mask support.

18. The printing device according to claim 17, further comprising:

a detection sensor arranged between the mask support and the mask replacement unit, the detection sensor being configured to detect a state in which at least one of the first mask or the second mask straddles the mask support and the mask replacement unit.

19. The printing device according to claim 16, further comprising:

a detection sensor arranged between the mask support and the mask replacement unit, the detection sensor being configured to detect a state in which at least one of the first mask or the second mask straddles the mask support and the mask replacement unit.

20. The printing device according to claim 1, wherein the squeegee and the moving member are integrally arranged in a squeegee unit; and the squeegee and the moving member are configured to integrally move as the squeegee unit moves.

* * * * *